(12) United States Patent
Waidhas et al.

(10) Patent No.: US 12,525,562 B2
(45) Date of Patent: Jan. 13, 2026

(54) ASSEMBLY OF 2XD MODULE USING HIGH DENSITY INTERCONNECT BRIDGES

(71) Applicant: Intel Corporation, Santa Clara, CA (US)

(72) Inventors: Bernd Waidhas, Pettendorf (DE); Andreas Wolter, Regensburg (DE); Georg Seidemann, Landshut (DE); Thomas Wagner, Regelsbach (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/399,220

(22) Filed: Dec. 28, 2023

(65) Prior Publication Data
US 2024/0128223 A1  Apr. 18, 2024

Related U.S. Application Data

(63) Continuation of application No. 17/131,663, filed on Dec. 22, 2020, now Pat. No. 12,125,815.

(51) Int. Cl.
*H01L 23/31* (2006.01)
*H01L 23/00* (2006.01)
*H01L 23/538* (2006.01)

(52) U.S. Cl.
CPC .......... *H01L 24/20* (2013.01); *H01L 23/3157* (2013.01); *H01L 23/5386* (2013.01); *H01L 24/06* (2013.01); *H01L 24/13* (2013.01); *H01L 2924/3511* (2013.01); *H01L 2924/381* (2013.01)

(58) Field of Classification Search
CPC ........................................................ H01L 24/20
See application file for complete search history.

(56) References Cited

U.S. PATENT DOCUMENTS

| | | | |
|---|---|---|---|
| 8,546,955 B1 * | 10/2013 | Wu ...................... | H01L 23/5384 |
| | | | 257/723 |
| 9,653,428 B1 * | 5/2017 | Hiner ..................... | H01L 24/96 |
| 10,535,608 B1 * | 1/2020 | Rubin ..................... | H01L 24/73 |
| 10,943,869 B2 * | 3/2021 | Zhai ....................... | H01L 24/96 |

(Continued)

FOREIGN PATENT DOCUMENTS

| | | |
|---|---|---|
| WO | WO-2015138359 | 9/2015 |
| WO | WO-2018009145 | 1/2018 |

OTHER PUBLICATIONS

Extended European Search Report from European Patent Application No. 23220744.9, mailed Jun. 5, 2024, 17 pgs.

(Continued)

*Primary Examiner* — William A Harriston
(74) *Attorney, Agent, or Firm* — Schwabe, Williamson & Wyatt P.C.

(57) ABSTRACT

Embodiments disclosed herein include electronic package and methods of forming such packages. In an embodiment, an electronic package comprises a mold layer and a first die embedded in the mold layer. In an embodiment, the first die comprises first pads at a first pitch and second pads at a second pitch. In an embodiment, the electronic package further comprises a second die embedded in the mold layer, where the second die comprises third pads at the first pitch and fourth pads at the second pitch. In an embodiment, a bridge die is embedded in the mold layer, and the bridge die electrically couples the second pads to the fourth pads.

20 Claims, 23 Drawing Sheets

(56) References Cited

U.S. PATENT DOCUMENTS

| | | | |
|---|---|---|---|
| 11,728,273 B2* | 8/2023 | Haba | H01L 25/0652 |
| | | | 257/777 |
| 12,125,776 B2* | 10/2024 | Li | H01L 21/486 |
| 2006/0226527 A1* | 10/2006 | Hatano | H01L 23/5389 |
| | | | 438/109 |
| 2013/0063843 A1* | 3/2013 | Chen | H01L 23/49811 |
| | | | 361/56 |
| 2014/0049932 A1* | 2/2014 | Camarota | G01R 31/28 |
| | | | 361/807 |
| 2015/0270209 A1* | 9/2015 | Woychik | H01L 21/565 |
| | | | 257/774 |
| 2017/0110407 A1 | 4/2017 | Chaware | |
| 2017/0271307 A1 | 9/2017 | Hiner | |
| 2017/0365580 A1 | 12/2017 | Shih | |
| 2019/0115319 A1* | 4/2019 | Hiner | H01L 21/563 |
| 2019/0371778 A1 | 12/2019 | Sankman | |
| 2020/0227384 A1* | 7/2020 | Liff | H01L 23/49838 |
| 2022/0199574 A1* | 6/2022 | Karhade | H01L 23/3157 |
| 2022/0254721 A1* | 8/2022 | Pietambaram | H01L 25/0652 |

OTHER PUBLICATIONS

Office Action for Taiwan Patent Application No. 110134485 mailed May 10, 2024, 12 pgs.
Office Action for U.S. Appl. No. 17/131,663 mailed Feb. 2, 2024, 13 pgs.
Partial Search Report from European Patent Application No. 21196293.1, mailed Apr. 4, 2022, 13 pgs.
Extended European Search Report from European Patent Application No. 21196293.1, mailed Oct. 20, 2022, 16 pgs.
Office Action from Korean Patent Application No. KR 10-2021-0156261 mailed Jan. 16, 2025, 22 pgs.
Final Office Action from Korean Patent Application No. KR 10-2021-0156261 mailed Jul. 3, 2025, 8 pgs.
Notice of Allowance for Taiwan Patent Application No. 110134485 mailed Aug. 4, 2025, 3 pgs.

* cited by examiner

ASSEMBLY OF 2XD MODULE USING HIGH DENSITY INTERCONNECT BRIDGES

CROSS-REFERENCE TO RELATED APPLICATIONS

This application is a continuation of U.S. patent application Ser. No. 17/131,663, filed on Dec. 22, 2022, the entire contents of which is hereby incorporated by reference herein.

TECHNICAL FIELD

Embodiments of the present disclosure relate to electronic packages, and more particularly to multi-chip packages with high density interconnect bridges.

BACKGROUND

The move to multi-die modules has led to the need for advanced interconnect architectures in order to accommodate the multiple dies. In one type of architecture, multiple dies are attached to an interposer that provides electrical coupling between the multiple dies. However, the area of the interposer has to be at least as large as the sum of the areas of the several dies and include an additional assembly and routing overhead. The growth of the area of the interposer increases the cost and provides manufacturability issues.

In another approach, embedded bridges are provided in the package substrate. The bridges provide high density routing in order to electrically couple the multiple dies together. However, since multiple bridge dies are needed, there is an issue with obtaining proper alignment for all of the bridge dies. Alignment is also made difficult due to warpage of the package substrate in which the bridge dies are embedded. As the number of bridge dies necessary for the package increase, alignment issues become an increasingly difficult design challenge.

EMBODIMENTS OF THE PRESENT DISCLOSURE

Figure 1:
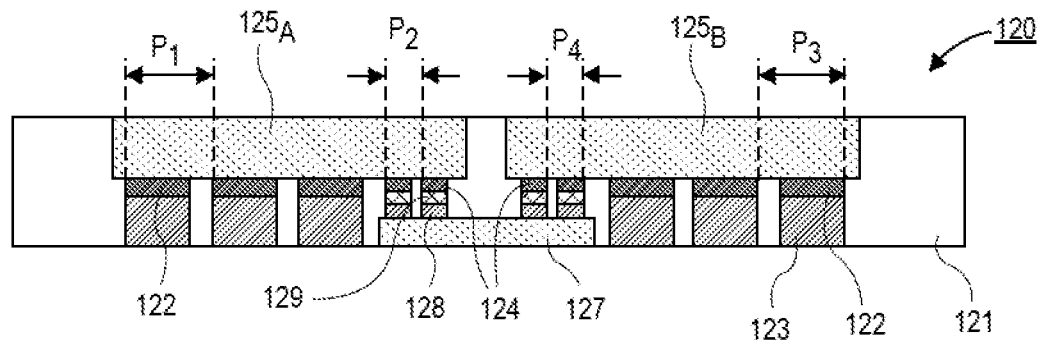
FIG. 1 is a cross-sectional illustration of a multi-chip module that comprises a bridge embedded in a mold layer to couple a first die to a second die, in accordance with an embodiment.

Described herein are multi-chip packages with high density interconnect bridges, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current multi-chip architectures, such as interposers and embedded bridges, have significant limitations that lead to difficult engineering and cost increases. Accordingly, embodiments disclosed herein include multi-chip modules that are assembled using improved processes. The multi-chip modules described herein include a first die, a second die, and a bridge die that electrically couples the first die to the second die. The first die, the second die, and the bridge die are embedded in a mold layer. Particularly, alignment between the multiple dies is made easier by assembling the dies together while supported by a dimensionally stable carrier. As such, there is substantially no warpage or planarity issues during assembly. After the dies are coupled together, the multiple dies are embedded in a mold layer.

Such multi-chip modules provide flexibility for various packaging architectures. In one embodiment, the multi-chip module may be connected to a package substrate through solder balls. In some embodiments, the multi-chip module may be connected to an interposer that is between the multi-chip module and the package substrate. In yet another embodiment, the multi-chip module may be directly connected to a board, such as a printed circuit board (PCB).

Embodiments may also allow for improved routing flexibility by providing a redistribution layer over a surface of the mold layer. The redistribution layer may allow for pitch spreading in order to allow for easier assembly with other components, such as a package substrate, an interposer, or a board. The redistribution layer may also include a power supply mesh and/or thermal improvement via (e.g., dummy pads).

Embodiments disclosed herein also allow for the stacking of multiple multi-chip modules. Stacking capability may be enabled through the use of through silicon vias (TSVs) through the base dies and/or the bridge die. Stacking modules enables increased capacity and performance of the multi-chip module while maintaining a smaller footprint.

Additionally, embodiments include pad designs that enable flexibility in the alignment of the base dies to the bridge die. For example, the pads on the base die may be elongated and angled with respect to an edge of the base die. As such, even when the base dies are misaligned, the bridge die may be displaced in order to allow for successful coupling of the two base dies. In other embodiments, multiple bridge dies with different interconnect patterns may be provided in the assembly facility. The bridge die with the interconnect pattern that most closely matches a misalignment between the base dies may be used in the assembly.

Referring now to FIG. 1, a cross-sectional illustration of a multi-chip module 120 is shown, in accordance with an embodiment. In an embodiment, the multi-chip module 120 may comprise a first base die $125_A$ and a second base die $125_B$. The first base die $125_A$ and the second base die $125_B$ may comprise any type of die, such as, but not limited to, a processor, a graphics processor, a field-programmable gate array (FPGA), a memory die, or the like. The first base die $125_A$ and the second base die $125_B$ may comprise first pads 122 and second pads 124. On the first base die $125_A$, the first pads 122 may have a first pitch $P_1$, and the second pads 124 may have a second pitch $P_2$. The second pitch $P_2$ is smaller than the first pitch $P_1$ in some embodiments. The smaller pitch $P_2$ allows for high density routing in the attached bridge die 127. In an embodiment, the first pitch $P_1$ may be approximately 55 µm or larger, and the second pitch $P_2$ may be smaller than 55 µm. For example, the second pitch may be approximately 20 µm or smaller. On the second base die $125_B$, the first pads 122 may have a third pitch $P_3$, and the second pads 124 may have a fourth pitch $P_4$ that is smaller than the third pitch $P_3$. In an embodiment, the first pitch $P_1$ may be substantially equal to the third pitch $P_3$, or the first pitch $P_1$ may be different than the third pitch $P_3$. In an embodiment, the second pitch $P_2$ may be substantially equal to the fourth pitch $P_4$, or the second pitch $P_2$ may be different than the fourth pitch $P_4$.

In an embodiment, the second pads 124 on the first base die $125_A$ are proximate to an edge of the first base die $125_A$ next to the second base die $125_B$, and the second pads 124 on the second base die $125_B$ are proximate to an edge of the second base die $125_B$ next to the first base die $125_A$. A bridge die 127 spanning between the first base die $125_A$ and the second base die $125_B$ is connected to the second pads 124. In the illustrated embodiment, bridge pads 128 on the bridge die 127 are coupled to second pads 124 by a solder 129. However, it is to be appreciated that any interconnect architecture may be used to couple bridge pads 128 to second pads 124. For example, copper to copper bonding may be used to form the connection.

In an embodiment, the bridge die 127 comprises silicon or another semiconductor material. The bridge die 127 may be a passive bridge or an active bridge. The bridge die 127 comprises a dimensionally stable substrate that allows for high density routing used to electrically couple the first base die $125_A$ to the second base die $125_B$.

In an embodiment, the first pads 122 may be contacted by conductive pillars 123. For example, the conductive pillars may include copper pillars or the like. The height of the conductive pillars 123 may be chosen so that the bottom surface of the conductive pillars 123 is substantially coplanar with a bottom surface of the bridge die 127. As will be described in the processing flows below, a polishing and/or grinding process may be used to provide coplanarity between the bridge die 127 and the conductive pillars 123. While conductive pillars 123 are shown in FIG. 1, it is to be appreciated that other interconnect architectures may be used to connect to the first pads 122. For example solder balls may be used, as will be described in greater detail below.

In an embodiment, the multi-chip module 120 may be embedded in a mold layer 121. The mold layer 121 may be any suitable molding compound, such as an epoxy or the like. In an embodiment, the mold layer 121 may have a first surface that is substantially coplanar with backside surfaces of the first base die $125_A$ and the second base die $125_B$. The mold layer 121 may also have a second surface that is substantially coplanar with surfaces of the bridge die 127 and the conductive pillars 123.

In an embodiment, the processes used to assemble the multi-chip module 120 may allow for significant thinning of one or both of the base dies $125_A$ and $125_B$ and the bridge die 127. As will be described in greater detail below, the base dies $125_A$ and $125_B$ and/or the bridge die 127 may be thinned so that they have thicknesses that are less than approximately 100 m, less than approximately 50 µm, or less than approximately 30 µm. This is a significant improvement over existing architectures that typically have die thicknesses of approximately 700 µm or greater.

Figure 2A:
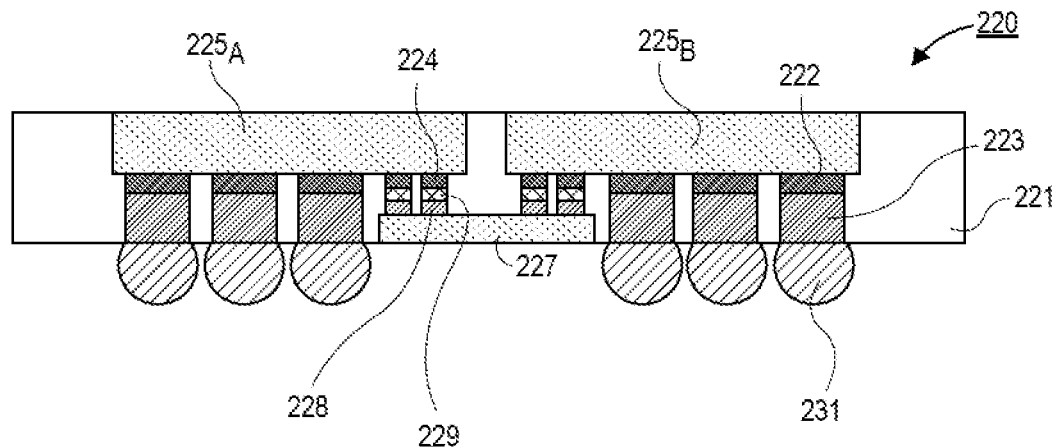
FIG. 2A is a cross-sectional illustration of a multi-chip module that comprises solder balls over conductive pillars, in accordance with an embodiment.

Referring now to FIG. 2A, a cross-sectional illustration of a multi-chip module 220 is shown, in accordance with an additional embodiment. In an embodiment, the multi-chip module 220 comprises a mold layer 221 that embeds a first base die $225_A$, a second base die $225_B$, and a bridge die 227. The bridge die 227 may electrically couple the first base die $225_A$ to the second base die $225_B$. For example, interconnects comprising second pads 224, solder 229 and bridge pads 228 connect the bridge die 227 to the base dies $225_A$ and $225_B$. In an embodiment, the first pads 222 of the base dies $225_A$ and $225_B$ are covered by conductive pillars 223. In an embodiment, the conductive pillars 223 may be covered by solder balls 231. The solder balls 231 allow for connection to other structures in an electronic system, as will be described below.

Figure 2B:
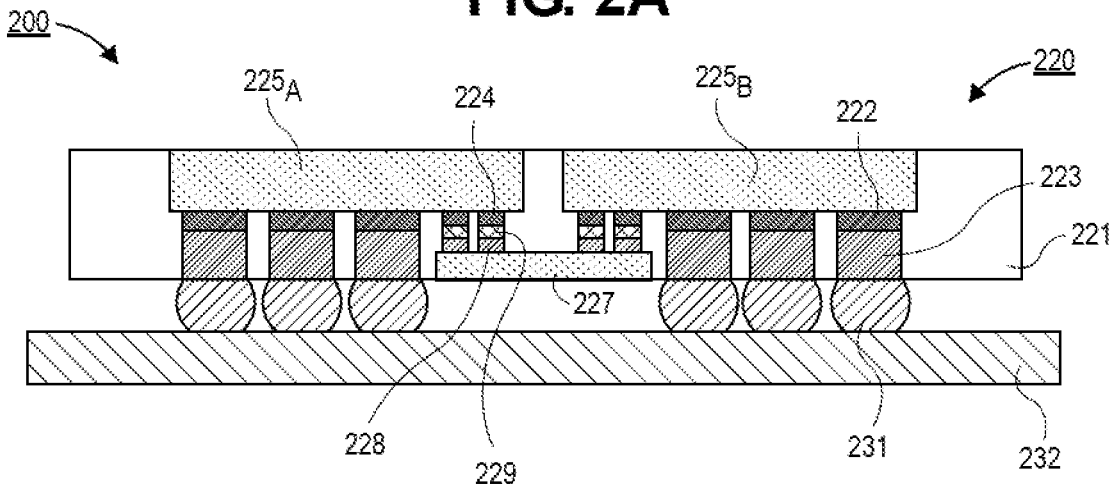
FIG. 2B is a cross-sectional illustration of a multi-chip module that is attached to a package substrate, in accordance with an embodiment.

Referring now to FIG. 2B, a cross-sectional illustration of the electronic system 200 with a multi-chip module 220 is shown, in accordance with an embodiment. In an embodiment, the multi-chip module 220 may be substantially similar to the multi-chip module 220 in FIG. 2A. In an embodiment, the multi-chip module 220 may be connected to a board 232 by the solder balls 231. The board 232 may be a PCB or the like. That is, the multi-chip module 220 may be directly coupled to a board without an intervening package substrate.

Figure 2C:
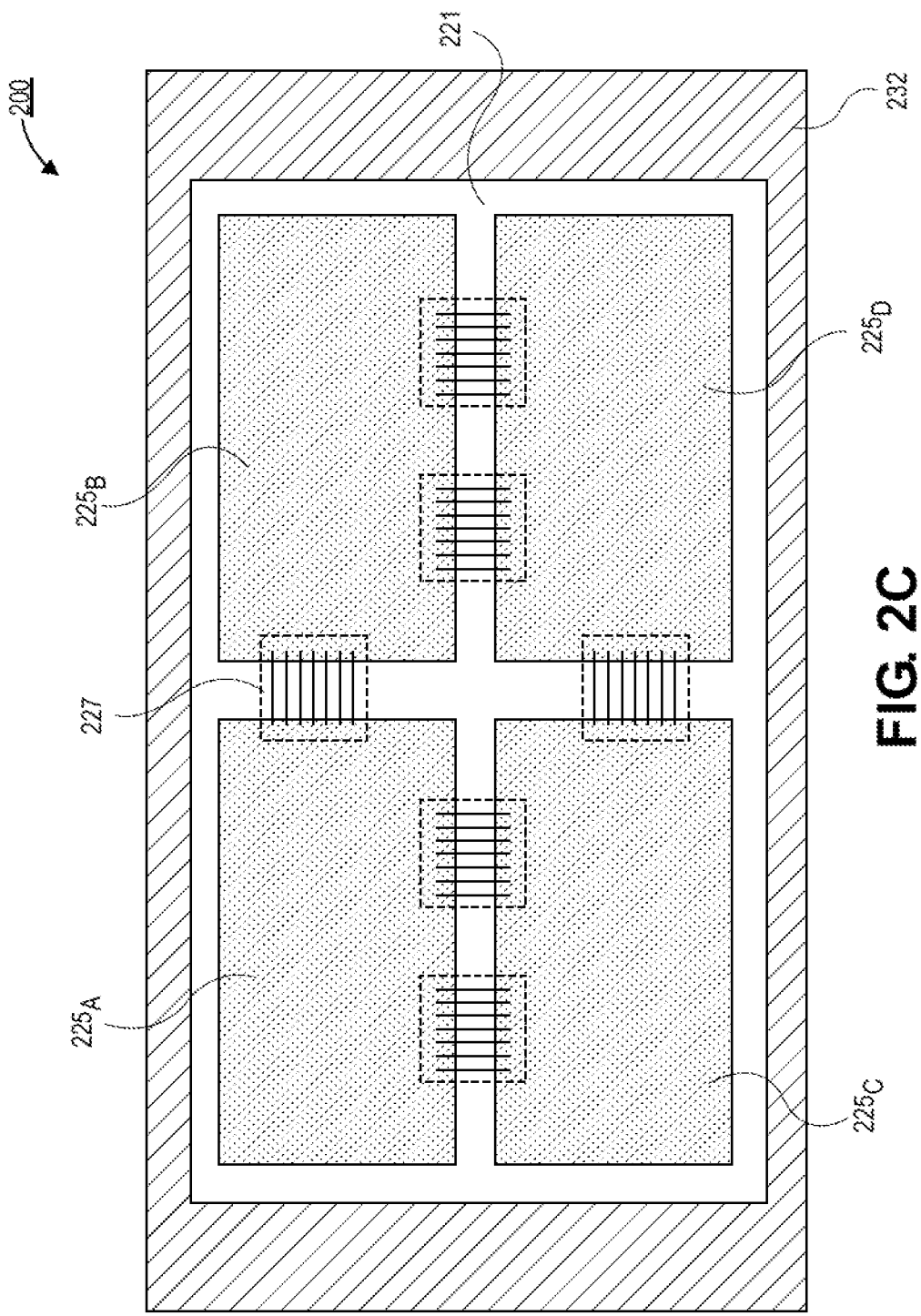
FIG. 2C is a plan view illustration of a multi-chip module with a plurality of dies and bridge dies connecting the dies together, in accordance with an embodiment.

Referring now to FIG. 2C, a plan view illustration of an electronic system 200 is shown, in accordance with an embodiment. As shown, a plurality of base dies $225_A$-$225_D$ are provided over the board 232. In an embodiment, a plurality of bridge dies 227 are provided to connect the plurality of base dies $225_A$-$225_D$ together. The bridge dies 227 and the plurality of base dies $225_A$-$225_D$ may be embedded in a mold layer 221.

Figure 2D:
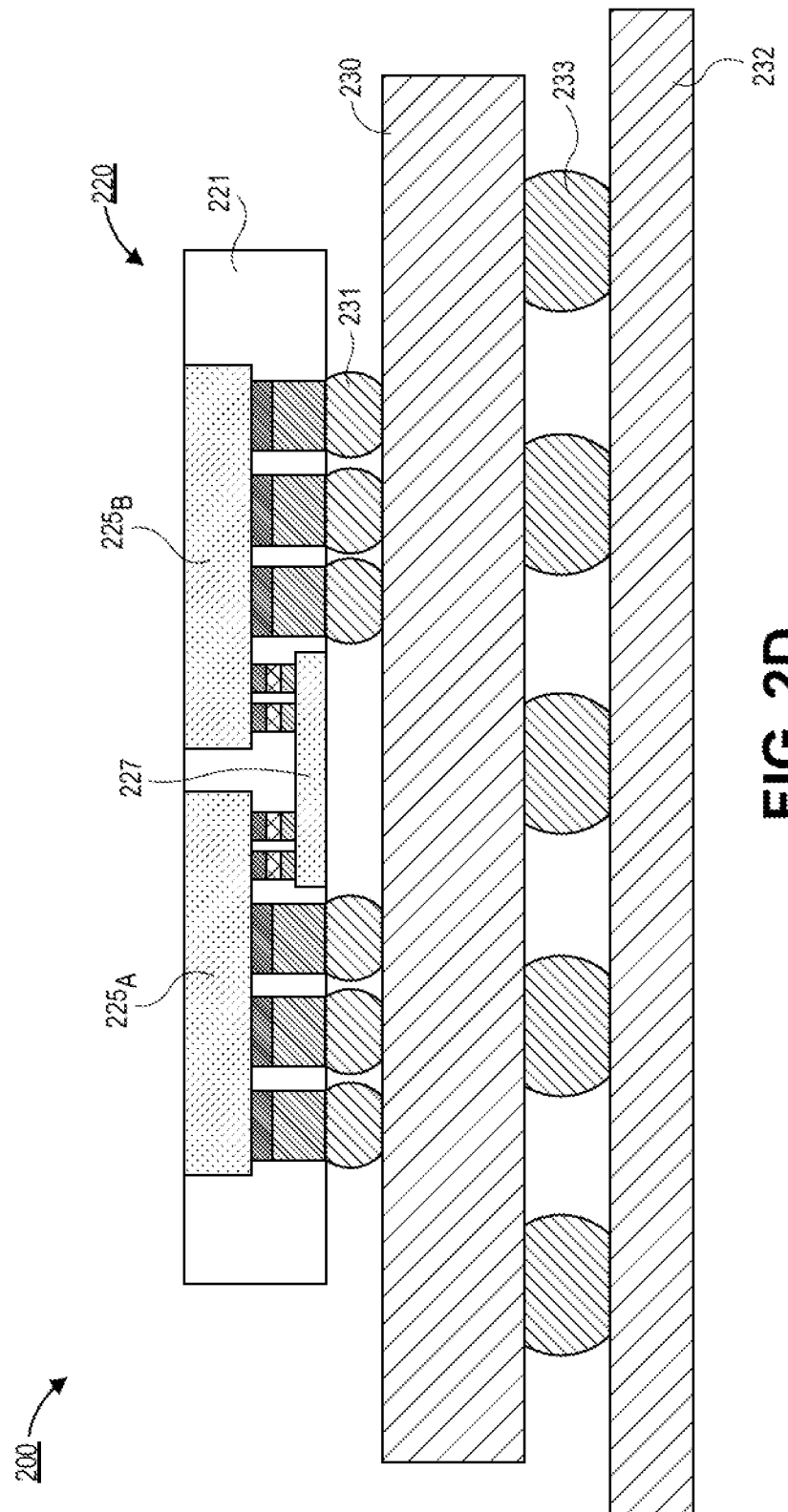
FIG. 2D is a cross-sectional illustration of an electronic system with a multi-chip module that is coupled to a board, in accordance with an embodiment.

Referring now to FIG. 2D, a cross-sectional illustration of an electronic system 200 is shown, in accordance with an additional embodiment. As shown in FIG. 2C, a multi-chip module 220 is attached to a package substrate 230 by solder balls 231 or the like. For example, solder balls 231 may be replaced with copper pillar bumps, LGA and solder paste printing, to name a couple. The package substrate 230 may comprise a plurality of conductive routing layers (not shown) embedded in a dielectric material. For example, the conductive routing layers may comprise pads, traces, vias, etc. that provide electrical coupling from a top surface of the package substrate 230 to a bottom surface of the package substrate. As shown, the package substrate 230 may be coupled to a board 232, such as a PCB. While solder balls 233 are shown connecting the package substrate 230 to the board 232, it is to be appreciated that any interconnect architecture may be used, such as sockets or the like.

Figure 2E:
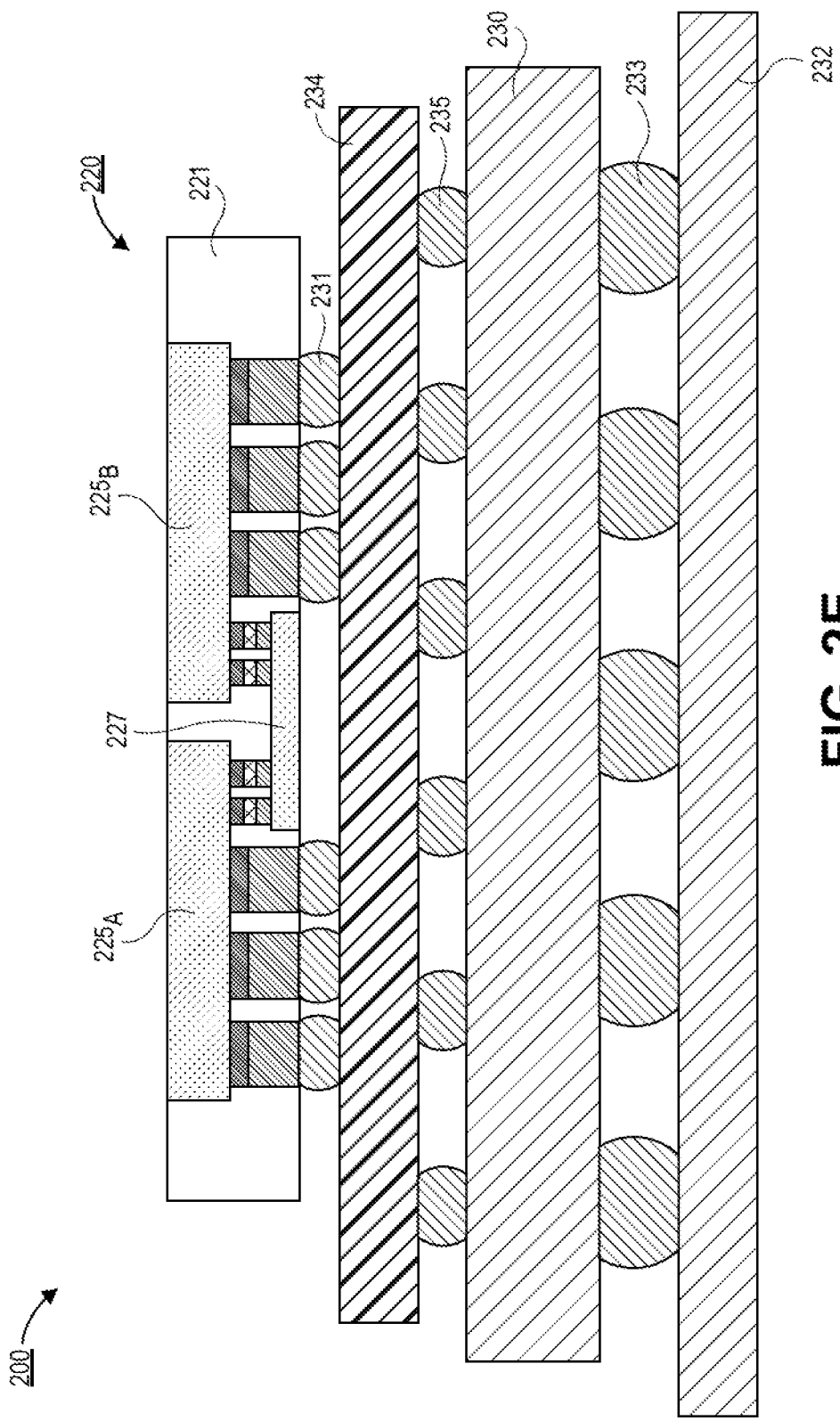
FIG. 2E is a cross-sectional illustration of an electronic system with a multi-chip module that is coupled to a package substrate by an interposer, in accordance with an embodiment.

Referring now to FIG. 2E, a cross-sectional illustration of an electronic system 200 is shown, in accordance with an additional embodiment. In an embodiment, the electronic system 200 in FIG. 2E may be substantially similar to the electronic system 200 in FIG. 2D, with the addition of an interposer 234. In an embodiment, the solder balls 231 may be coupled to the interposer 234 instead of the package substrate 230. The interposer 234 may comprise conductive routing (not shown). The conductive routing may provide pitch translation in order to spread the interconnects to a pitch that is more compatible with package substrate architectures. For example, the interposer 234 may be coupled to the package substrate 230 by solder bumps 235.

Figure 3A:
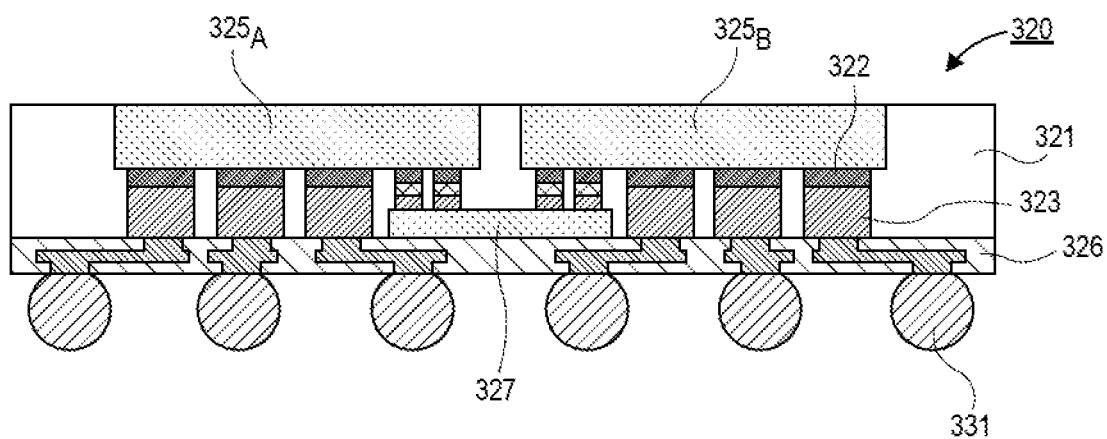
FIG. 3A is a cross-sectional illustration of a multi-chip module with a redistribution layer over conductive pillars, in accordance with an embodiment.

Referring now to FIG. 3A, a cross-sectional illustration of a multi-chip module 320 is shown, in accordance with an additional embodiment. In an embodiment, the multi-chip module 320 may be substantially similar to the multi-chip module 220 in FIG. 2A, with the addition of a redistribution layer 326 between the mold layer 321 and the solder balls 331. That is, the multi-chip module 320 may comprise a first base die $325_A$ and a second base die $325_B$ that are electrically coupled together by a bridge die 327.

In an embodiment, first pads 322 are coupled to the surface of the mold layer 321 by conductive pillars 323. In an embodiment, the conductive pillars 323 may be electrically coupled to the solder balls 331 through conductive routing in the redistribution layer 326. While a redistribution layer 326 is shown, it is to be appreciated that the redistribution layer 326 may be replaced with a laminated substrate in some embodiment. The redistribution layer 326 allows for pitch spreading to allow for easier integration with other components of an electronic system. Additionally, the redistribution layer may provide a location for a power supply mesh and/or thermal improvement via (e.g., dummy pads).

While a single redistribution layer 326 is shown, it is to be appreciated that any number of redistribution layers may be provided in the multi-chip module 320.

Figure 3B:
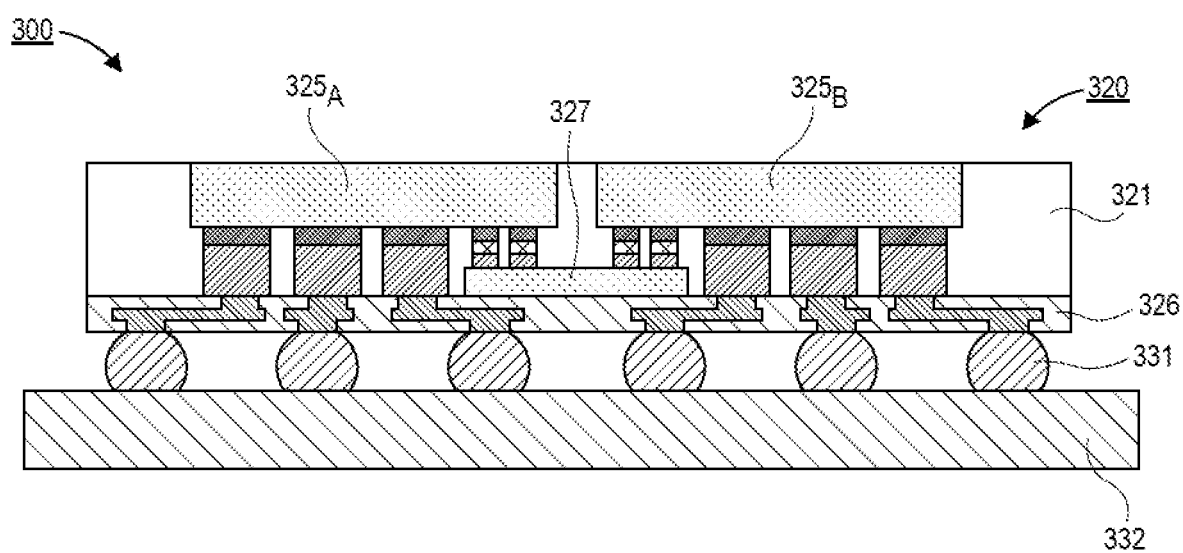
FIG. 3B is a cross-sectional illustration of a multi-chip module that is coupled to a package substrate, in accordance with an embodiment.

Referring now to FIG. 3B, a cross-sectional illustration of an electronic system 300 with a multi-chip module 320 is shown, in accordance with an embodiment. In an embodiment, the multi-chip module 320 is coupled to a board 332 by the solder balls 331. The board 332 may comprise a PCB or the like. That is, the multi-chip module 320 with a redistribution layer 326 may be directly coupled to the board 332 without an intervening package substrate.

Figure 3C:
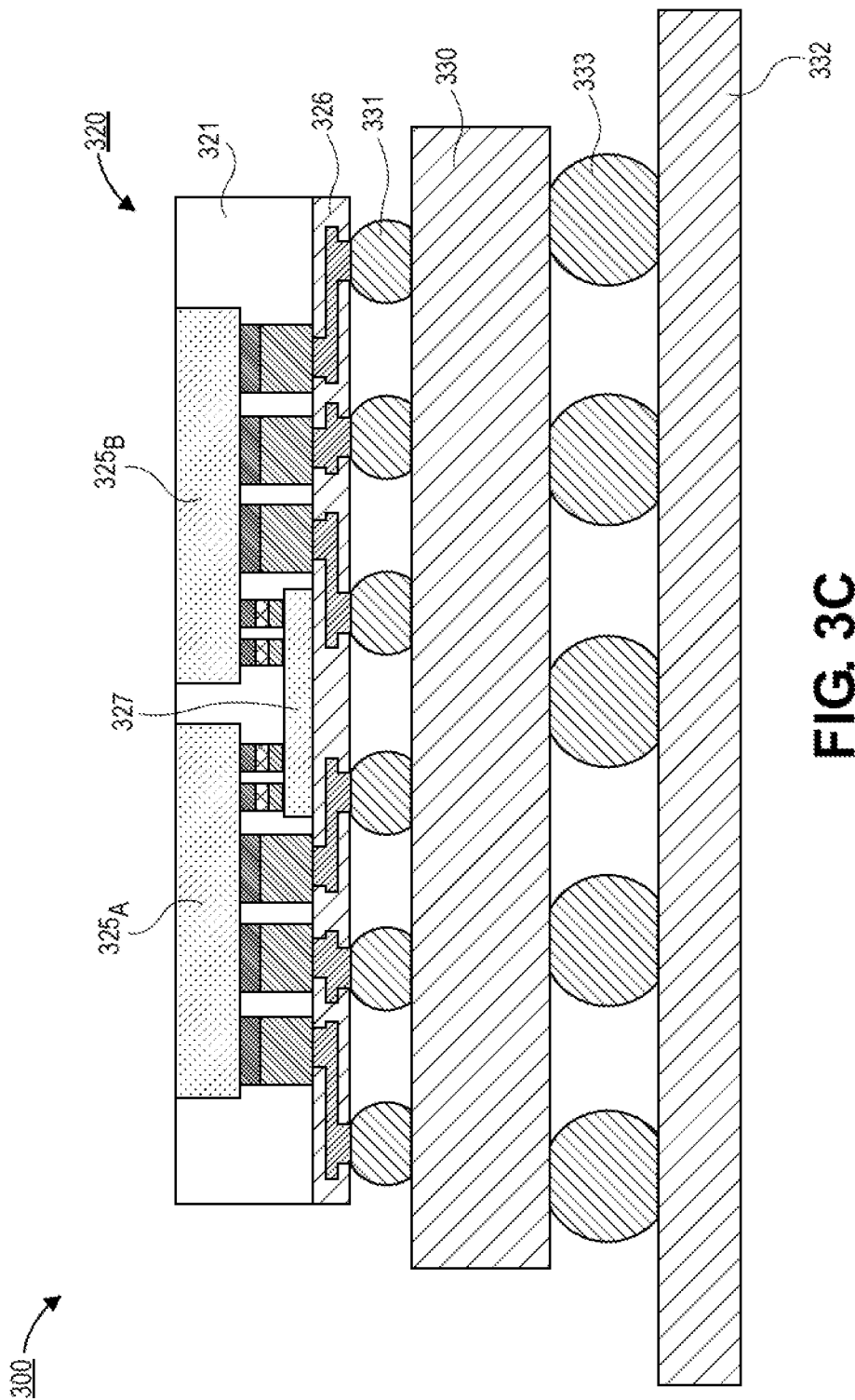
FIG. 3C is a cross-sectional illustration of an electronic system with a multi-chip module that is coupled to a board, in accordance with an embodiment.

Referring now to FIG. 3C, a cross-sectional illustration of an electronic system 300 is shown, in accordance with an additional embodiment. As shown, in FIG. 3C, a multi-chip module 320 with a redistribution layer 326 is attached to a package substrate 330 by solder balls 331. The package substrate 330 may comprise a plurality of conductive routing layers (not shown) embedded in a dielectric material. For example, the conductive routing layers may comprise pads, traces, vias, etc. that provide electrical coupling from a top surface of the package substrate 330 to a bottom surface of the package substrate. As shown, the package substrate 330 may be coupled to a board 332, such as a PCB. While solder balls 333 are shown connecting the package substrate 330 to the board 332, it is to be appreciated that any interconnect architecture may be used, such as sockets or the like.

Referring now to FIGS. 4A-4D a series of cross-sectional illustrations depicting a process for forming a multi-chip module is shown, in accordance with an embodiment. In an embodiment, the multi-chip module assembled in FIGS. 4A-4D may be used in one or more of the electronic systems 200/300 described above.

Figure 4A:
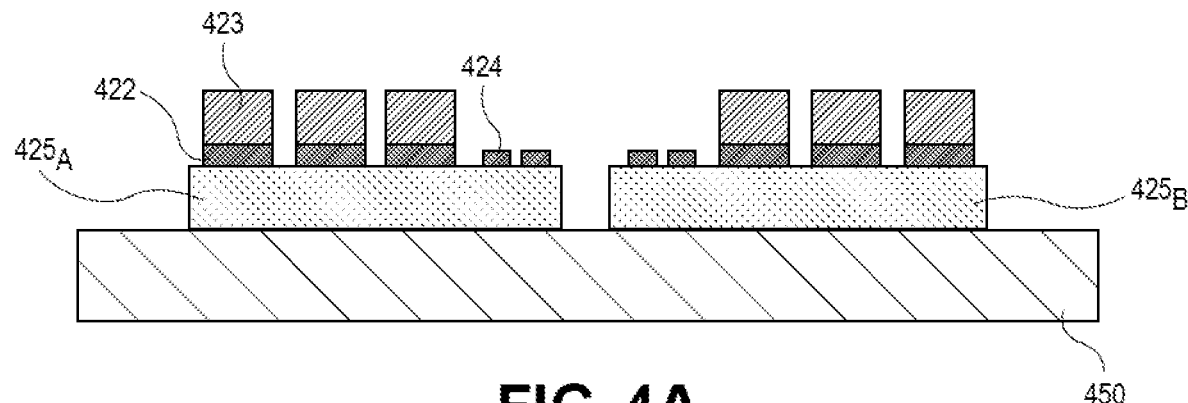
FIGS. 4A-4D are cross-sectional illustrations depicting a process for assembling a multi-chip module, in accordance with an embodiment.

Referring now to FIG. 4A, a cross-sectional illustration of a pair of base dies $425_A$ and $425_B$ on a carrier 450 is shown, in accordance with an embodiment. The first base die $425_A$ and the second base die $425_A$ may comprise first pads 422 and second pads 424. The first pads 422 may have a first pitch that is greater than a second pitch of the second pads 424. In an embodiment, interconnects, such as conductive pillars 423, may be provided over the first pads 422. For example, the conductive pillars 423 may comprise copper.

In an embodiment, the carrier 450 is a dimensionally stable material with a high stiffness. One objective of the carrier 450 is to provide a base that is not susceptible to warpage. As such, alignment between the first base die $425_A$, the second base die $425_B$, and a subsequently added bridge die 427 can be tightly controlled. In an embodiment, the carrier 450 may be glass or a metallic material. In some embodiments, the carrier may comprise silicon. In the illustrated embodiment, the first base die $425_A$ and the second base die $425_B$ are directly contacting the carrier 450. However, it is to be appreciated that a temporary adhesive may secure the base dies $425_A$ and $425_B$ to the carrier 450.

Figure 4B:
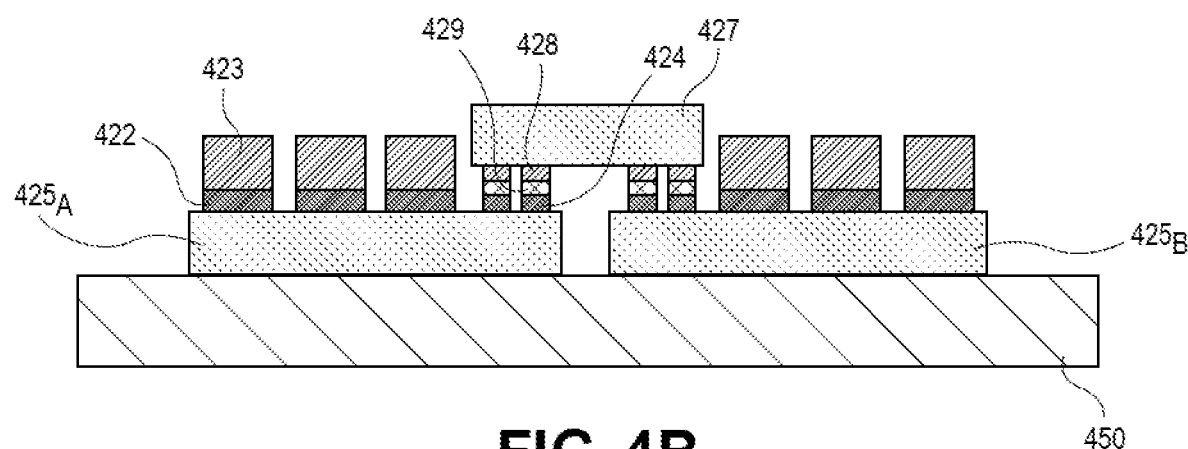

Referring now to FIG. 4B, a cross-sectional illustration of the structure after a bridge die 427 is attached to the base dies $425_A$ and $425_B$ is shown, in accordance with an embodiment. In an embodiment, the bridge die 427 may be attached using a flip chip mounting or the like. For example, solder 429 may secure second pads 424 to the bridge pads 428. In other embodiments, the bridge pads 428 may be connected to the second pads 424 directly using copper-to-copper bonding or the like.

In an embodiment, the bridge die 427 provides high density routing between the first base die $425_A$ and the second bridge die $425_B$. For example, the bridge die 427 may comprise a semiconductor substrate such as silicon. Fine line and pitch traces (not shown) on the bridge die 427 may connect bridge pads 428 over the first base die 425$_A$ to bridge pads 428 over the second base die 425$_B$.

Figure 4C:
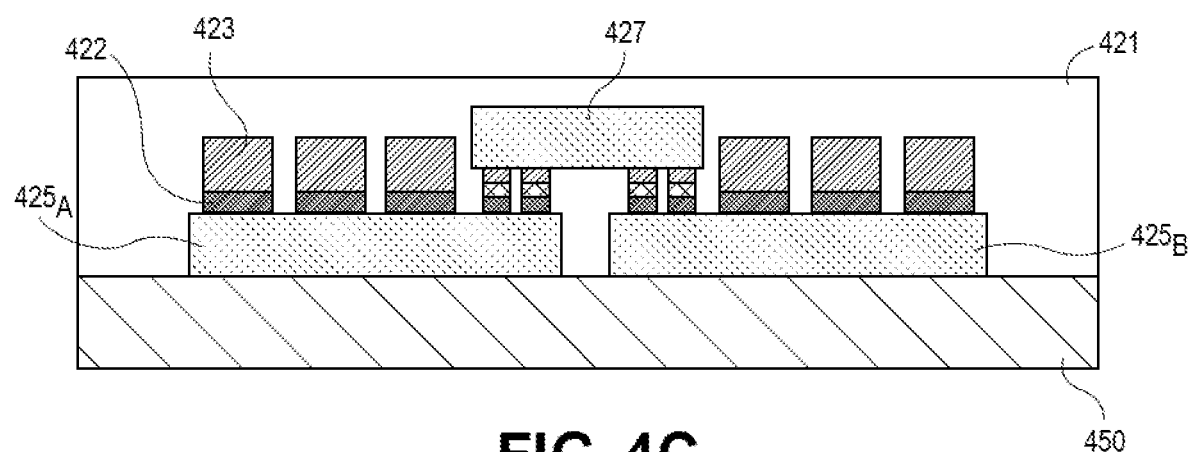

Referring now to FIG. 4C, a cross-sectional illustration of the structure after a mold layer 421 is disposed over the carrier 450 is shown, in accordance with an embodiment. In an embodiment, the mold layer 421 may be formed with an overmolding process. The mold layer 421 may comprise an epoxy or the like.

Figure 4D:
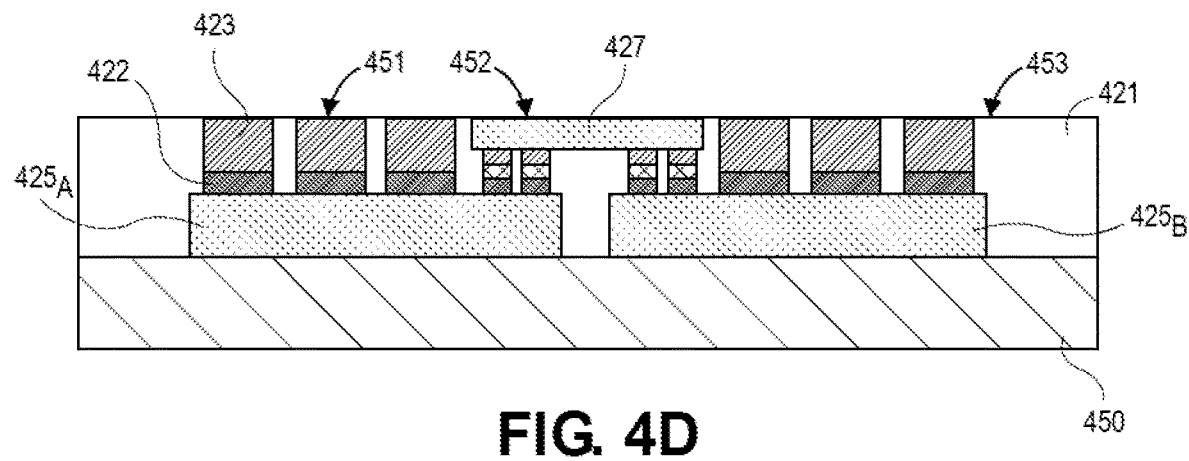

Referring now to FIG. 4D, a cross-sectional illustration of the structure after the mold layer 421 is recessed is shown, in accordance with an embodiment. In an embodiment, the mold layer 421 is recessed with a grinding process or the like. The mold layer 421 may be recessed to expose surfaces of the conductive pillars 423 and a backside surface of the bridge die 427. In an embodiment, the grinding process may include reducing the thickness of the bridge die 427 and/or the conductive pillars 423. In an embodiment, a surface 451 of the conductive pillars 423, a surface 452 of the bridge die 427, and a surface 453 of the mold layer 421 may be substantially coplanar with each other.

After the recessing process to expose the bridge die 427 and the conductive pillars 423, the carrier 450 may be removed. In other embodiments, a redistribution layer may be formed over the surfaces 451, 452, 453 prior to releasing the carrier 450. Alternatively solder balls may be attached to the conductive pillars 423 before or after the carrier 450 is removed. After removal of the carrier 450, the multi-chip module may be integrated into an electronic system such as those described above.

Referring now to FIGS. 5A-5D, a series of cross-sectional illustrations depicting a process for forming a multi-chip module is shown, in accordance with an additional embodiment. The multi-chip module in FIGS. 5A-5D may also comprise an additional component embedded in the mold layer and connected to one of the first base die and the second base die. In an embodiment, the multi-chip module assembled in FIGS. 5A-5D may be used in one or more of the electronic systems 200/300 described above.

Figure 5A:
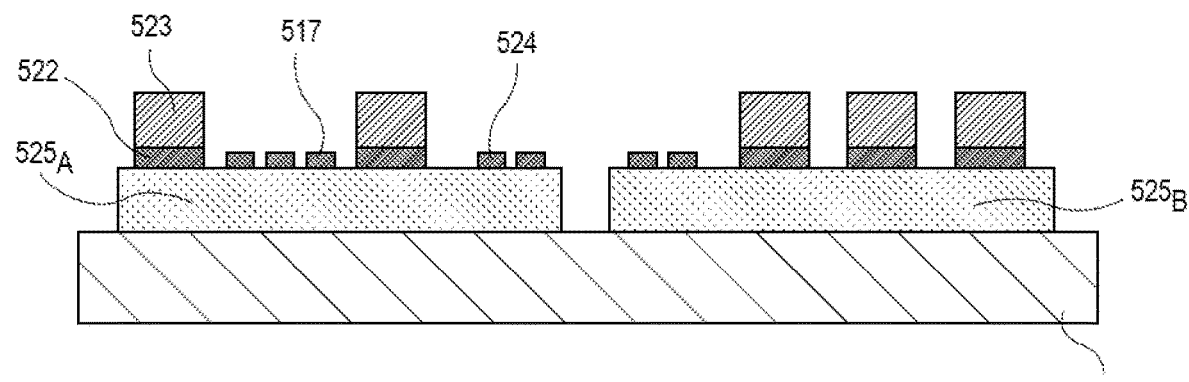
FIGS. 5A-5D are cross-sectional illustrations depicting a process for assembling a multi-chip module with a bridge die and a component die, in accordance with an embodiment.

Referring now to FIG. 5A, a cross-sectional illustration of a carrier 550 onto which a first base die 525$_A$ and a second bae die 525$_B$ are attached is shown, in accordance with an embodiment. The first base die 525$_A$ and the second base die 525$_A$ may comprise first pads 522 and second pads 524. The first pads 522 may have a first pitch that is greater than a second pitch of the second pads 524. In an embodiment, interconnects, such as conductive pillars 523, may be provided over the first pads 522. For example, the conductive pillars 523 may comprise copper.

In an embodiment, one or both of the first base die 525$_A$ and the second base die 525$_B$ may comprise third pads 517. The third pads 517 may have a third pitch that is smaller than the first pitch. In some embodiments, the third pitch may be substantially similar to the second pitch of the second pads 524. The third pads 517 may be used to connect an additional component (not shown in FIG. 5A) to the first base die 525$_A$.

In an embodiment, the carrier 550 is a dimensionally stable material with a high stiffness. One objective of the carrier 550 is to provide a base that is not susceptible to warpage. As such, alignment between the first base die 525$_A$, the second base die 525$_B$, and a subsequently added bridge die 527 can be tightly controlled. In an embodiment, the carrier 550 may be glass or a metallic material. In some embodiments, the carrier may comprise silicon. In the illustrated embodiment, the first base die 525$_A$ and the second base die 525$_B$ are directly contacting the carrier 550. However, it is to be appreciated that a temporary adhesive may secure the base dies 525$_A$ and 525$_B$ to the carrier 550.

Figure 5B:
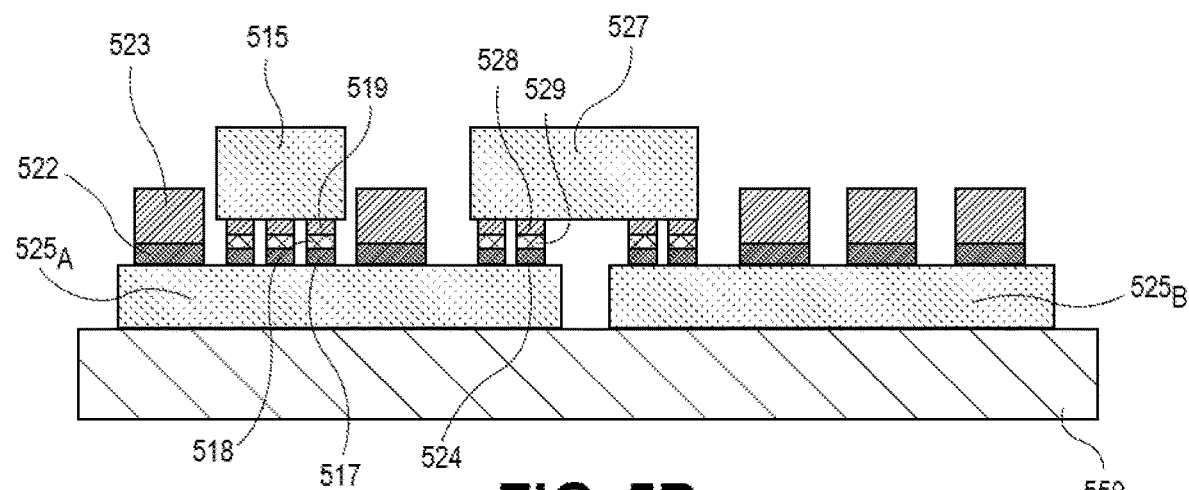

Referring now to FIG. 5B, a cross-sectional illustration of the structure after a bridge die 527 and a component 515 are attached to the base dies 525$_A$ and 525$_B$ is shown, in accordance with an embodiment. In an embodiment, the bridge die 527 may be attached using a flip chip mounting or the like. For example, solder 529 may secure second pads 524 to the bridge pads 528. In other embodiments, the bridge pads 528 may be connected to the second pads 524 directly using copper-to-copper bonding or the like. In an embodiment, a thickness of the component 515 and a thickness of the bridge die 527 may be substantially the same, or a thickness of the component 515 may be different than a thickness of the bridge die 527. Differences of thicknesses of the base dies 525$_A$ and 525$_B$ and/or its copper pillars can be easily compensated by variation of the thickness of the solder and/or copper pillars of the bridge die.

In an embodiment, the bridge die 527 provides high density routing between the first base die 525$_A$ and the second bridge die 525$_B$. For example, the bridge die 527 may comprise a semiconductor substrate such as silicon. Fine line and pitch traces (not shown) on the bridge die 527 may connect bridge pads 528 over the first base die 525$_A$ to bridge pads 528 over the second base die 525$_B$.

In an embodiment, the component 515 is connected to the third pads 517. For example, the component 515 may be attached with a flip chip process. The third pads 517 may be coupled to component pads 519 by a solder 518 or the like. Alternatively, a copper-to-copper connection between the third pads 517 and the component pads 519 may be used. In an embodiment, the component 515 may be any discrete component that is used for the operation of the first base die 525$_A$. For example, the component 515 may comprise a filter, a passive (e.g., capacitor, inductor, etc.), or the like and/or active devices (e.g. voltage regulators, SRAMs, Memories etc.).

Figure 5C:
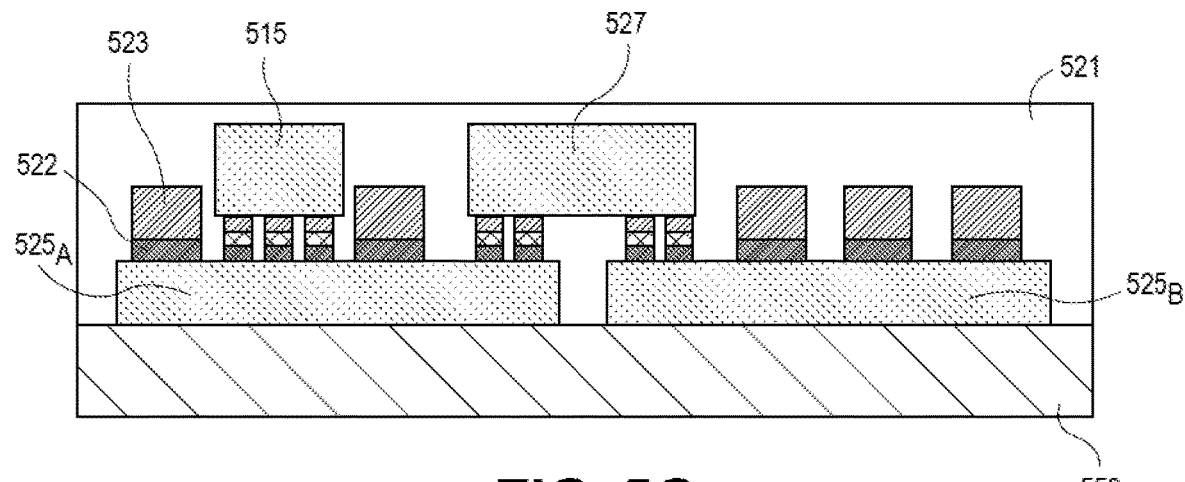

Referring now to FIG. 5C, a cross-sectional illustration of the structure after a mold layer 521 is disposed over the carrier 550 is shown, in accordance with an embodiment. In an embodiment, the mold layer 521 may be formed with an overmolding process. The mold layer 521 may comprise an epoxy or the like.

Figure 5D:
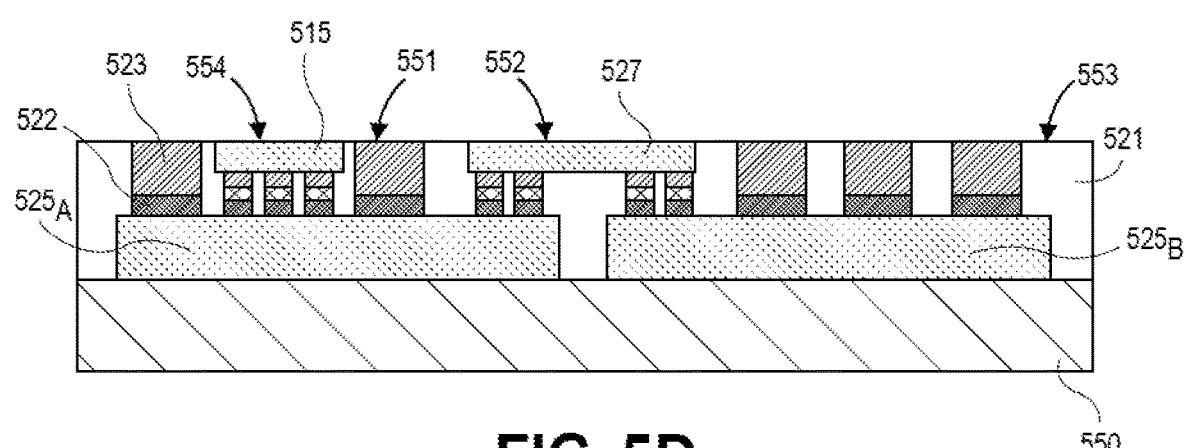

Referring now to FIG. 5D, a cross-sectional illustration of the structure after the mold layer 521 is recessed is shown, in accordance with an embodiment. In an embodiment, the mold layer 521 is recessed with a grinding process or the like. The mold layer 521 may be recessed to expose surfaces of the conductive pillars 523, a backside surface of the bridge die 527, and a backside surface of the component 515. In an embodiment, the grinding process may include reducing the thickness of the bridge die 527, the component 515, and/or the conductive pillars 523. In an embodiment, a surface 551 of the conductive pillars 523, a surface 552 of the bridge die 527, a surface 554 of the component 515, and a surface 553 of the mold layer 521 may be substantially coplanar with each other.

After the recessing process to expose the bridge die 527, the component 515, and the conductive pillars 523, the carrier 550 may be removed. In other embodiments, a redistribution layer may be formed over the surfaces 551, 552, 553, 554 prior to releasing the carrier 550. Alternatively solder balls may be attached to the conductive pillars 523 before or after the carrier 550 is removed. After removal of the carrier 550, the multi-chip module may be integrated into an electronic system such as those described above.

Referring now to FIGS. 6A-6F, a series of cross-sectional illustrations depicting a process for assembling a multi-chip module is shown, in accordance with an additional embodiment. In the embodiment shown in FIGS. 6A-6F the conductive pillars are replaced with partially embedded solder balls that contact the first pads. In an embodiment, the multi-chip module assembled in FIGS. 6A-6F may be used in one or more of the electronic systems 200/300 described above.

Figure 6A:
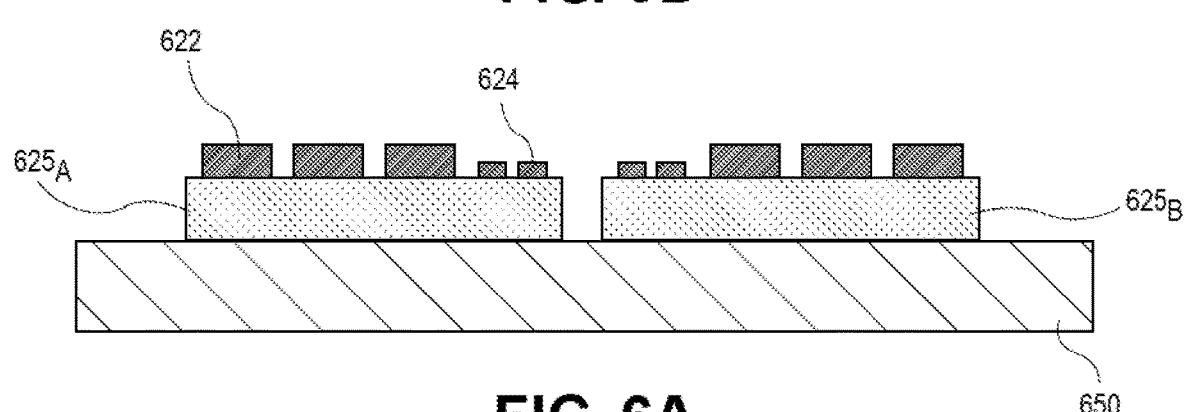
FIGS. 6A-6F are cross-sectional illustrations depicting a process for assembling a multi-chip module with solder balls at least partially embedded in the mold layer, in accordance with an embodiment.

Referring now to FIG. 6A, a cross-sectional illustration of a pair of base dies $625_A$ and $625_B$ on a carrier 650 is shown, in accordance with an embodiment. The first base die $625_A$ and the second base die $625_A$ may comprise first pads 622 and second pads 624. The first pads 622 may have a first pitch that is greater than a second pitch of the second pads 624.

In an embodiment, the carrier 650 is a dimensionally stable material with a high stiffness. One objective of the carrier 650 is to provide a base that is not susceptible to warpage. As such, alignment between the first base die $625_A$, the second base die $625_B$, and a subsequently added bridge die 627 can be tightly controlled. In an embodiment, the carrier 650 may be glass or a metallic material. In some embodiments, the carrier may comprise silicon. In the illustrated embodiment, the first base die $625_A$ and the second base die $625_B$ are directly contacting the carrier 650. However, it is to be appreciated that a temporary adhesive may secure the base dies $625_A$ and $625_B$ to the carrier 650.

Figure 6B:
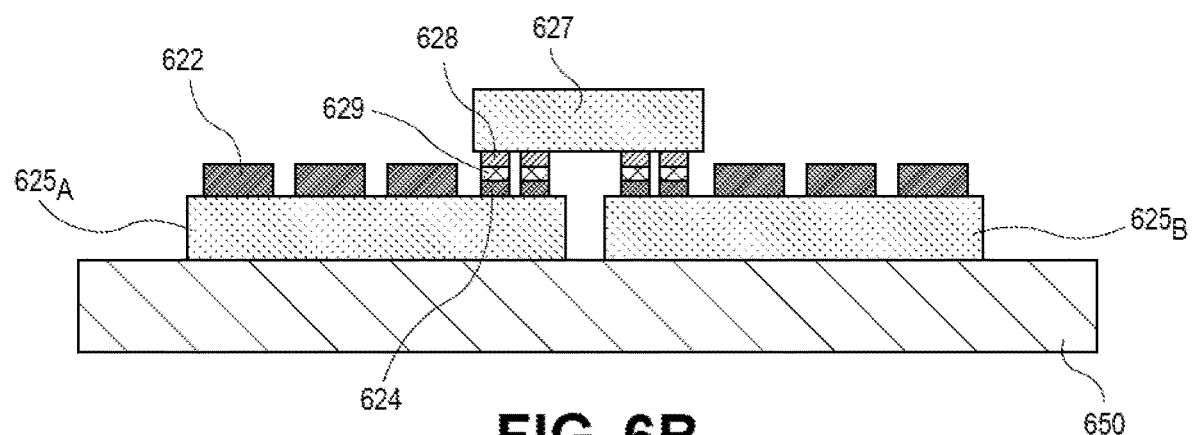

Referring now to FIG. 6B, a cross-sectional illustration of the structure after a bridge die 627 is attached to the base dies $625_A$ and $625_B$ is shown, in accordance with an embodiment. In an embodiment, the bridge die 627 may be attached using a flip chip mounting or the like. For example, solder 629 may secure second pads 624 to the bridge pads 628. In other embodiments, the bridge pads 628 may be connected to the second pads 624 directly using copper-to-copper bonding or the like.

In an embodiment, the bridge die 627 provides high density routing between the first base die $625_A$ and the second base die $625_B$. For example, the bridge die 627 may comprise a semiconductor substrate such as silicon. Fine line and pitch traces (not shown) on the bridge die 627 may connect bridge pads 628 over the first base die $625_A$ to bridge pads 628 over the second base die $625_B$.

Figure 6C:
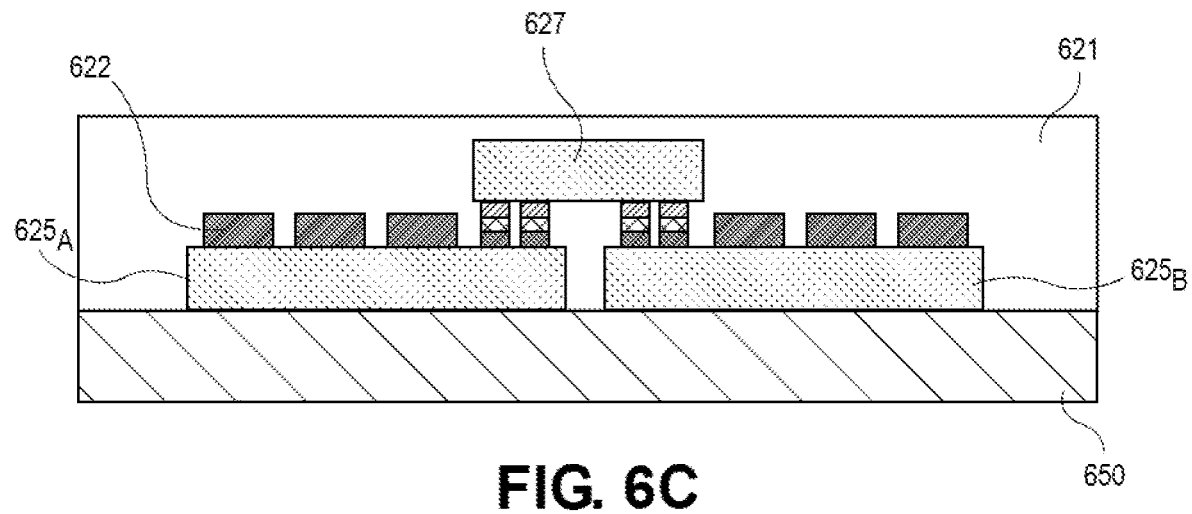

Referring now to FIG. 6C, a cross-sectional illustration of the structure after a mold layer 621 is disposed over the carrier 650 is shown, in accordance with an embodiment. In an embodiment, the mold layer 621 may be formed with an overmolding process. The mold layer 621 may comprise an epoxy or the like.

Figure 6D:
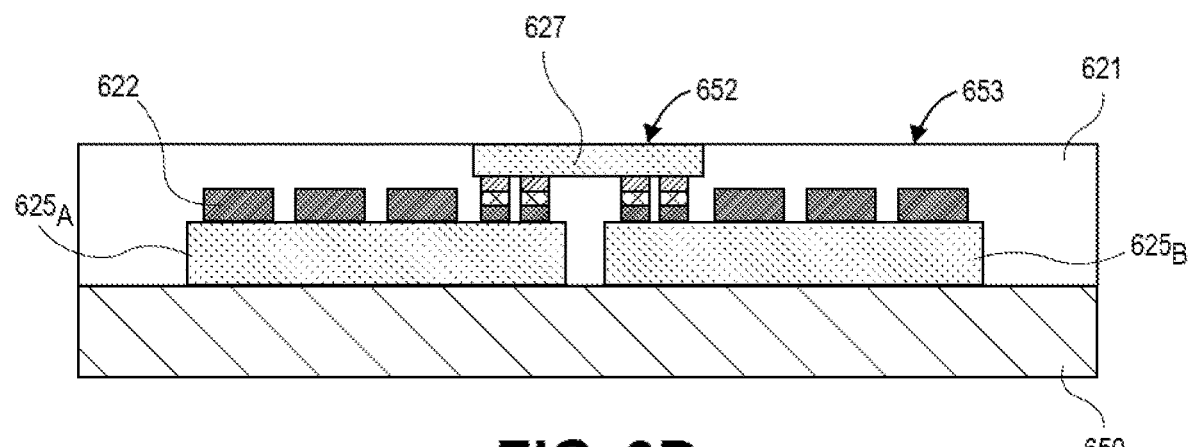

Referring now to FIG. 6D, a cross-sectional illustration of the structure after the mold layer 621 is recessed is shown, in accordance with an embodiment. In an embodiment, the mold layer 621 is recessed with a grinding process or the like. The mold layer 621 may be recessed to expose a backside surface of the bridge die 627. In an embodiment, the grinding process may include reducing the thickness of the bridge die 627. In an embodiment, a surface 652 of the bridge die 627 and a surface 653 of the mold layer 621 may be substantially coplanar with each other.

Figure 6E:
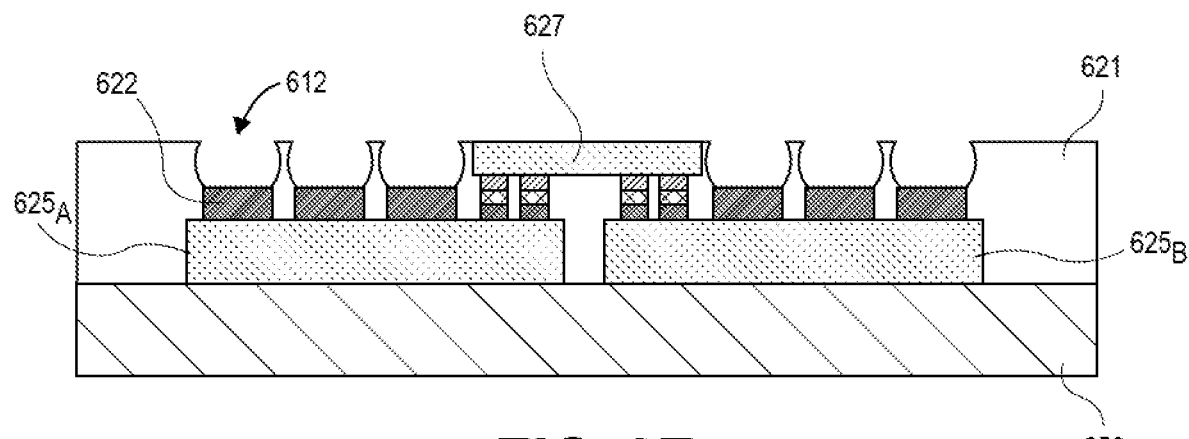

Referring now to FIG. 6E, a cross-sectional illustration of the structure after openings 612 are formed into the mold layer 621 is shown, in accordance with an embodiment. In an embodiment, the openings 612 expose surfaces of the first pads 622. The openings 612 may be formed with a laser drilling process or the like.

Figure 6F:
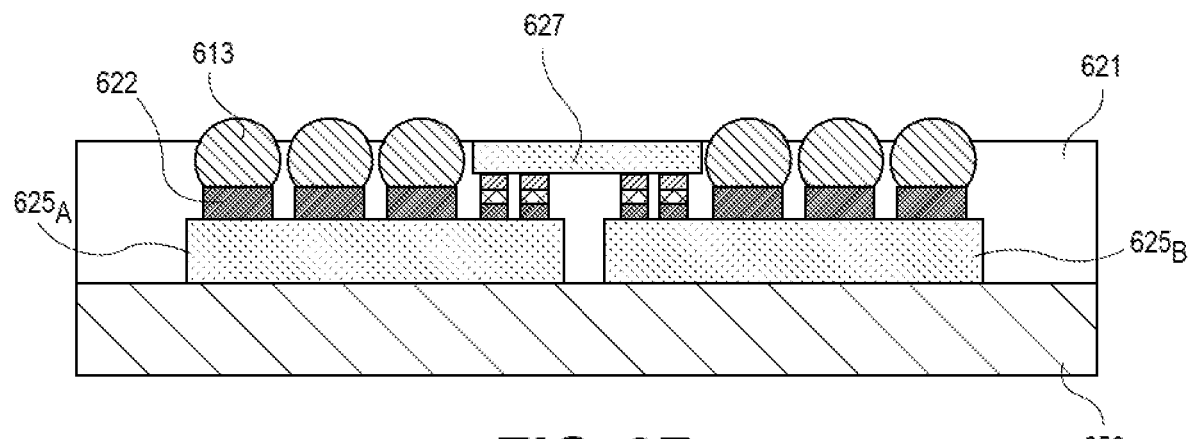

Referring now to FIG. 6F, a cross-sectional illustration of the structure after solder balls 613 are placed in the openings 612 is shown, in accordance with an embodiment. In an embodiment, the solder balls 613 may be at least partially embedded in the mold layer 621. That is, a portion of the solder balls 613 may be surrounded by the mold layer 621 and a portion of the solder balls 613 may be exposed.

After the solder balls 613 are applied, the carrier 650 may be removed. After removal of the carrier 650, the multi-chip module may be integrated into an electronic system such as those described above.

Referring now to FIGS. 7A-7F, a series of cross-sectional illustrations depicting a process for forming a multi-chip module with stacked dies is shown, in accordance with an embodiment. As shown in FIGS. 7A-7F, the stacked architecture is made possible by including TSVs through the bridge die and/or the base dies. In an embodiment, the multi-chip module assembled in FIGS. 7A-7F may be used in one or more of the electronic systems 200/300 described above.

Figure 7A:
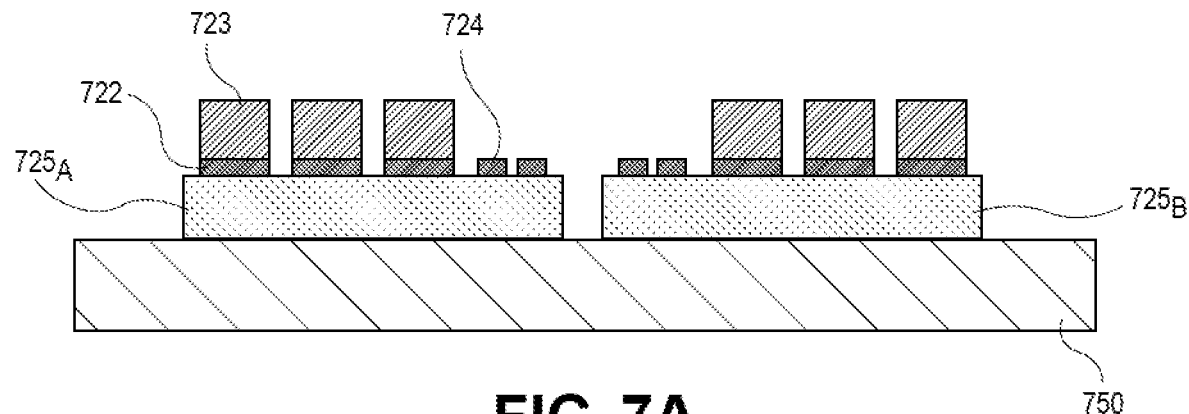
FIGS. 7A-7F are cross-sectional illustrations depicting a process for assembling a multi-chip module with multiple layers of dies, in accordance with an embodiment.

Referring now to FIG. 7A, a cross-sectional illustration of a pair of base dies $725_A$ and $725_B$ on a carrier 750 is shown, in accordance with an embodiment. The first base die $725_A$ and the second base die $725_A$ may comprise first pads 722 and second pads 724. The first pads 722 may have a first pitch that is greater than a second pitch of the second pads 724. In an embodiment, interconnects, such as conductive pillars 723, may be provided over the first pads 722. For example, the conductive pillars 723 may comprise copper.

In an embodiment, the carrier 750 is a dimensionally stable material with a high stiffness. One objective of the carrier 750 is to provide a base that is not susceptible to warpage. As such, alignment between the first base die $725_A$, the second base die $725_B$, and a subsequently added bridge die 727 can be tightly controlled. In an embodiment, the carrier 750 may be glass or a metallic material. In some embodiments, the carrier may comprise silicon. In the illustrated embodiment, the first base die $725_A$ and the second base die $725_B$ are directly contacting the carrier 750. However, it is to be appreciated that a temporary adhesive may secure the base dies $725_A$ and $725_B$ to the carrier 750.

Figure 7B:
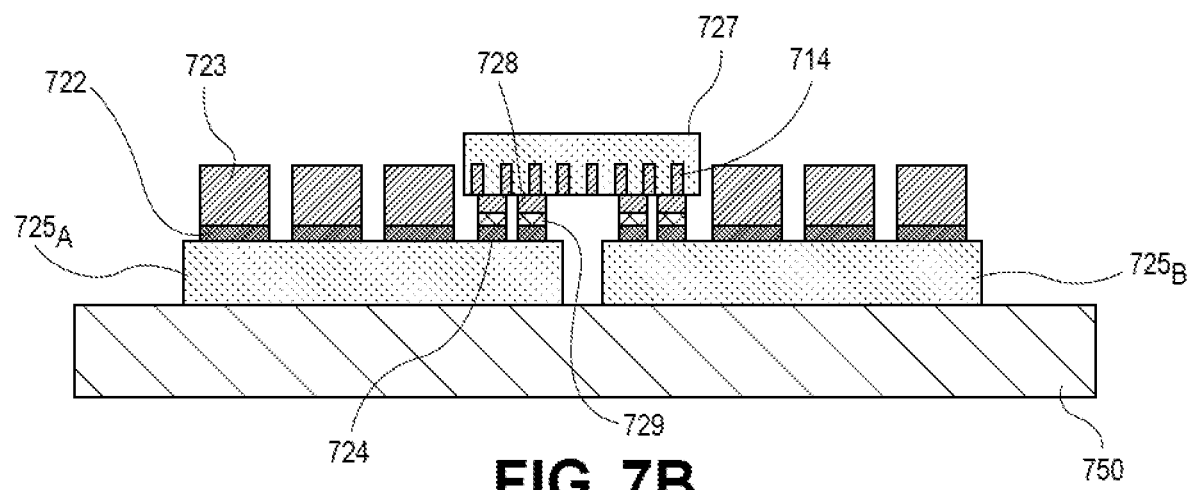

Referring now to FIG. 7B, a cross-sectional illustration of the structure after a bridge die 727 is attached to the base dies $725_A$ and $725_B$ is shown, in accordance with an embodiment. In an embodiment, the bridge die 727 may be attached using a flip chip mounting or the like. For example, solder 729 may secure second pads 724 to the bridge pads 728. In other embodiments, the bridge pads 728 may be connected to the second pads 724 directly using copper-to-copper bonding or the like.

In an embodiment, the bridge die 727 provides high density routing between the first base die $725_A$ and the second bridge die $725_B$. For example, the bridge die 727 may comprise a semiconductor substrate such as silicon. Fine line and pitch traces (not shown) on the bridge die 727 may connect bridge pads 728 over the first base die $725_A$ to bridge pads 728 over the second base die $725_B$. In an embodiment, the bridge die 727 may comprise TSVs 714. The TSVs 714 may pass partially through a thickness of the bridge die 727.

Figure 7C:
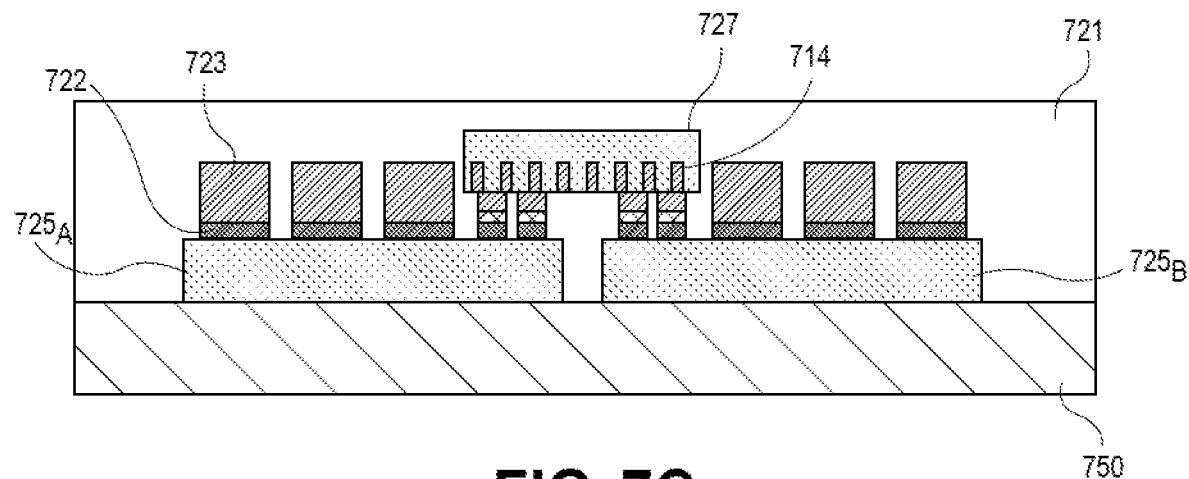

Referring now to FIG. 7C, a cross-sectional illustration of the structure after a mold layer 721 is disposed over the carrier 750 is shown, in accordance with an embodiment. In an embodiment, the mold layer 721 may be formed with an overmolding process. The mold layer 721 may comprise an epoxy or the like.

Figure 7D:
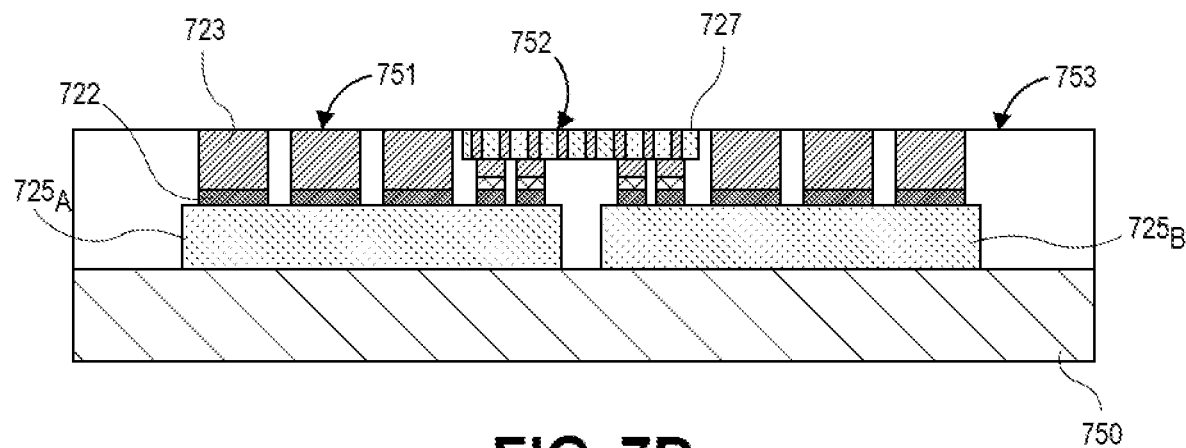

Referring now to FIG. 7D, a cross-sectional illustration of the structure after the mold layer 721 is recessed is shown, in accordance with an embodiment. In an embodiment, the mold layer 721 is recessed with a grinding process or the like. The mold layer 721 may be recessed to expose surfaces of the conductive pillars 723 and a backside surface of the bridge die 727. In some embodiments where the TSVs 714 do not pass entirely through a thickness of the bridge die 727 in FIG. 7C, the grinding process may be used to expose the TSVs 714. In an embodiment, the grinding process may include reducing the thickness of the bridge die 727 and/or the conductive pillars 723. In an embodiment, a surface 751 of the conductive pillars 723, a surface 752 of the bridge die 727, and a surface 753 of the mold layer 721 may be substantially coplanar with each other.

Figure 7E:
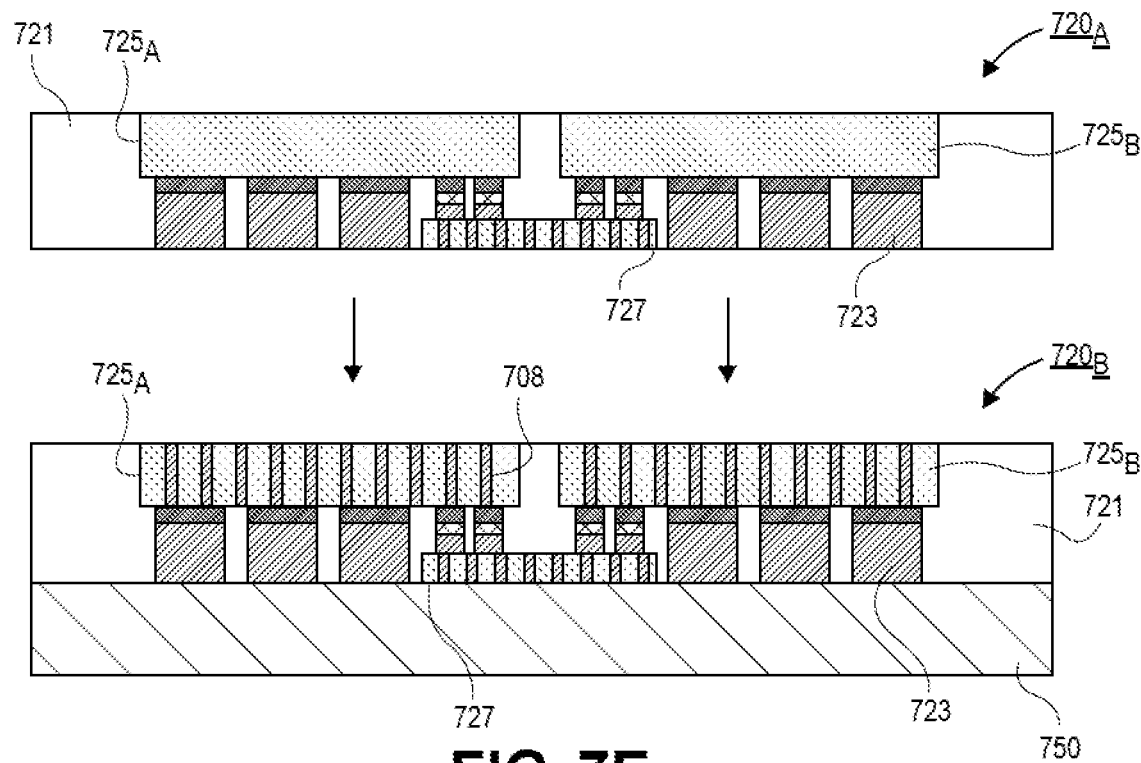

Referring now to FIG. 7E, a cross-sectional illustration of the structure during a stacking process is shown, in accordance with an embodiment. As shown, a first multi-chip module $720_A$ is flipped over to provide the bridge die 727 on the bottom surface of the mold layer 721. The first multi-chip module $720_A$ may be similar to the structure in FIG. 7D, after the removal of the carrier 750 from the first base die $725_A$ and the second base die $725_B$.

In an embodiment, the first multi-chip module $720_A$ is attached to the second multi-chip module $720_B$, as indicated by the arrows. In an embodiment, the second multi-chip module $720_B$ may be substantially similar to the first multi-chip module $720_A$, with the exception of the first die $725_A$ and the second die $725_B$ having TSVs 708.

Figure 7F:
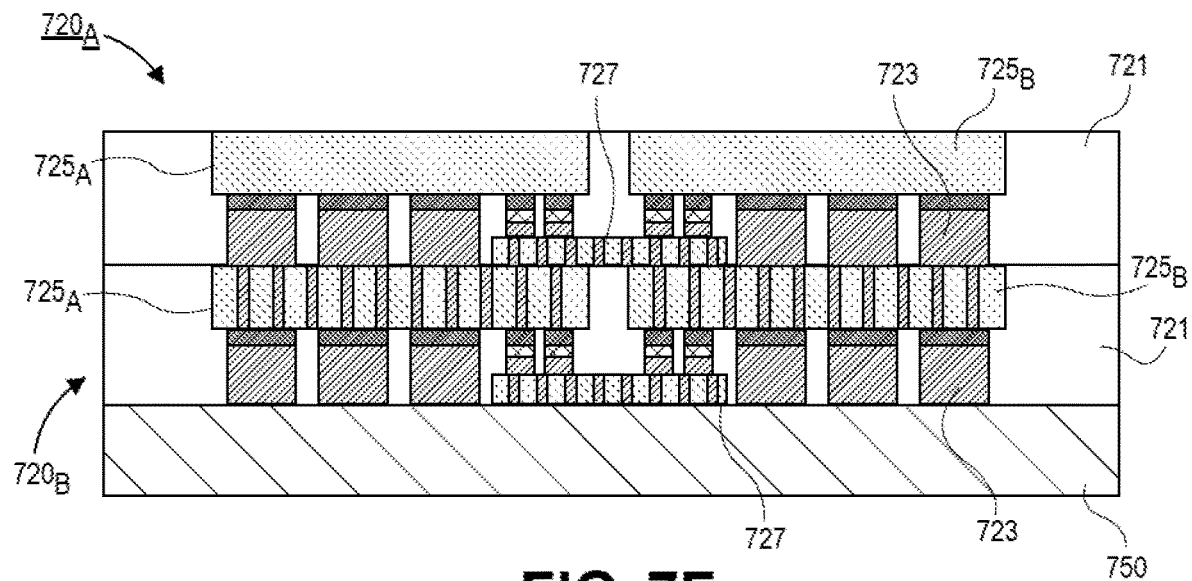

Referring now to FIG. 7F, a cross-sectional illustration of the structure after the first multi-chip module $720_A$ is attached to the second multi-chip module $720_B$ is shown, in accordance with an embodiment. In an embodiment, a backside metallization and solder (not shown) may be provided between the first multi-chip module $720_A$ and the second multi-chip module $720_B$ to provide electrical coupling between the two layers.

Figure 7G:
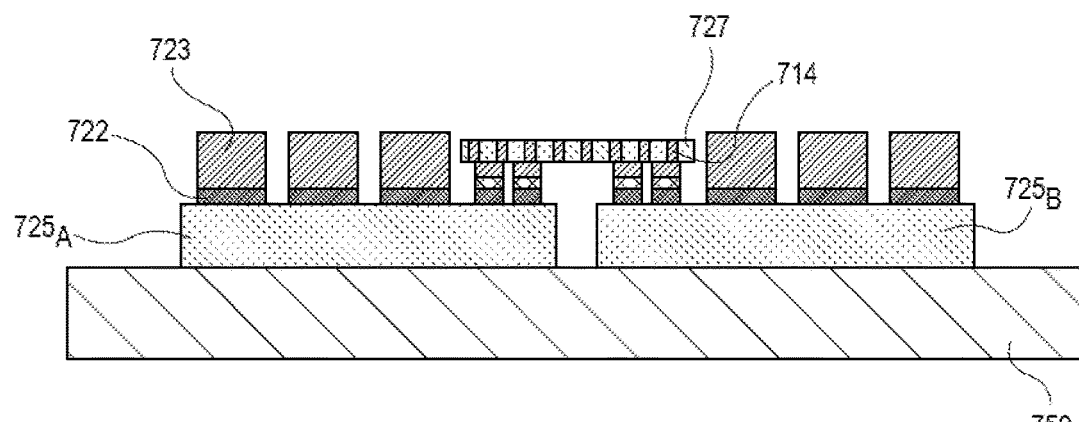
FIGS. 7G-7J are cross-sectional illustrations depicting a process for assembling a multi-chip module, in accordance with an additional embodiment.

Referring now to FIG. 7G, a cross-sectional illustration of a structure similar to the structure in FIG. 7B is shown, in accordance with an embodiment. The structure in FIG. 7G differs from the structure in FIG. 7B by having a bridge die 727 that is thinner. In a particular embodiment, the bridge die 727 may have a thickness that results in the top surface being below the top surface of the conductive pillars 723.

Figure 7H:
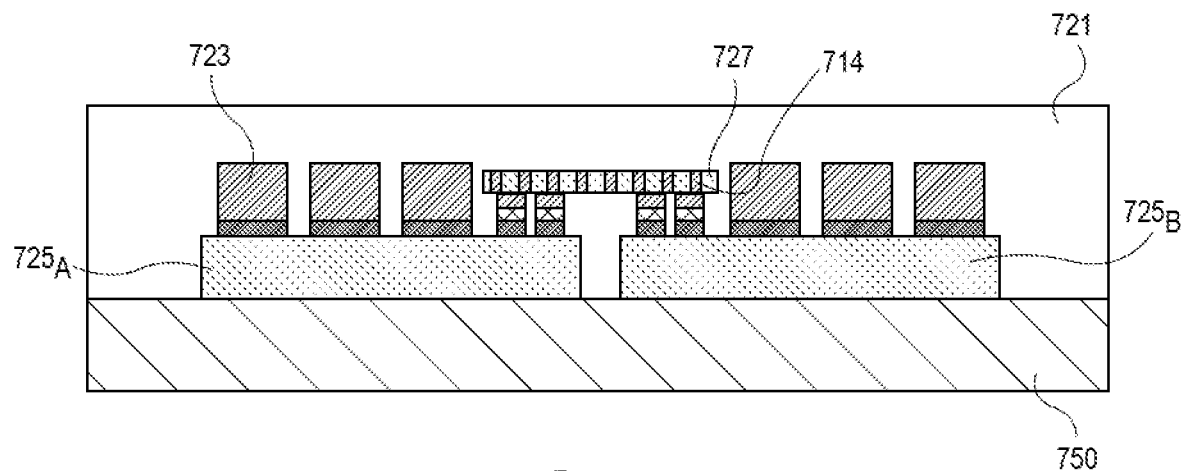

Referring now to FIG. 7H, a cross-sectional illustration of the structure after a mold layer 721 is disposed over the carrier 750 is shown, in accordance with an embodiment. In an embodiment, the mold layer 721 may be formed with an overmolding process. The mold layer 721 may comprise an epoxy or the like.

Figure 7I:
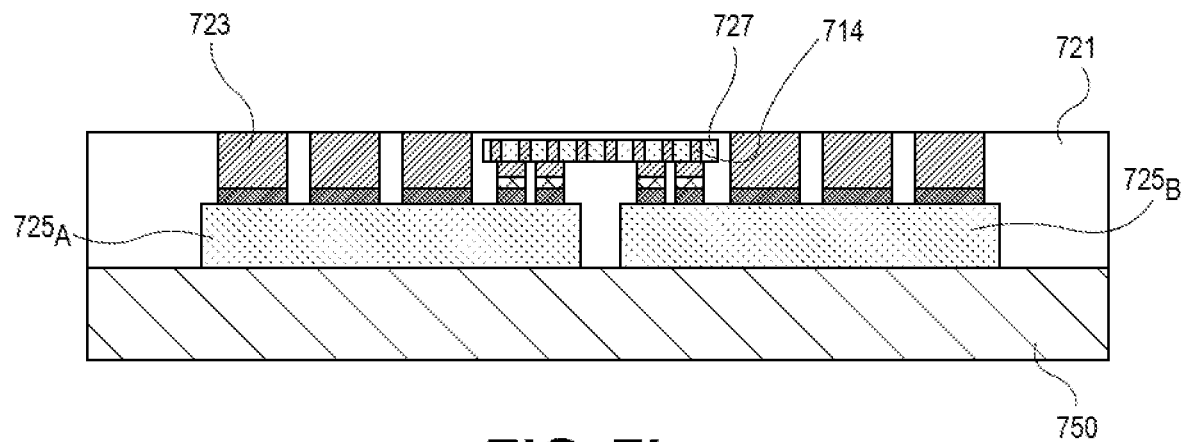

Referring now to FIG. 7I, a cross-sectional illustration of the structure after the mold layer 721 is recessed is shown, in accordance with an embodiment. In an embodiment, the mold layer 721 is recessed with a grinding process or the like. The mold layer 721 may be recessed to expose surfaces of the conductive pillars 723. In an embodiment, the bridge die 727 may still be embedded in the mold layer 721.

Figure 7J:
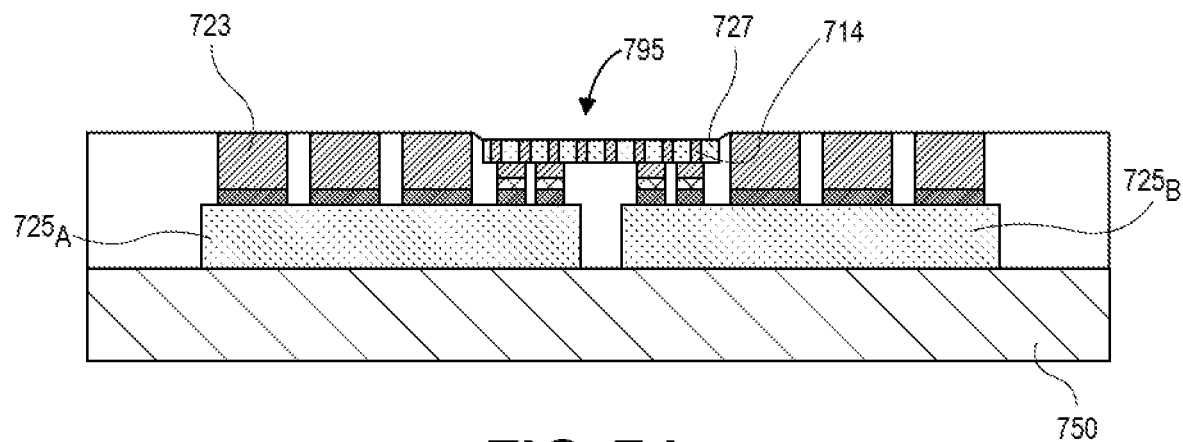

Referring now to FIG. 7J, a cross-sectional illustration of the structure after the mold layer 721 is recessed to form an opening 795 over the bridge die 727 is shown, in accordance with an embodiment. In an embodiment, the opening 795 may be formed with a laser ablation process, or the like. After formation of the opening 795, the processing may continue with operations substantially similar to those described with respect to FIGS. 7E-7F, and will not be repeated here.

Referring now to FIGS. 8A-8F, a series of cross-sectional illustrations depicting a process for forming a multi-chip module with thin base dies and a thin bridge die are shown, in accordance with an embodiment. Particularly, embodiments described herein provide a process that may enable die thicknesses that are approximately 30 μm or less. In an embodiment, the multi-chip module assembled in FIGS. 8A-8F may be used in one or more of the electronic systems 200/300 described above.

Figure 8A:
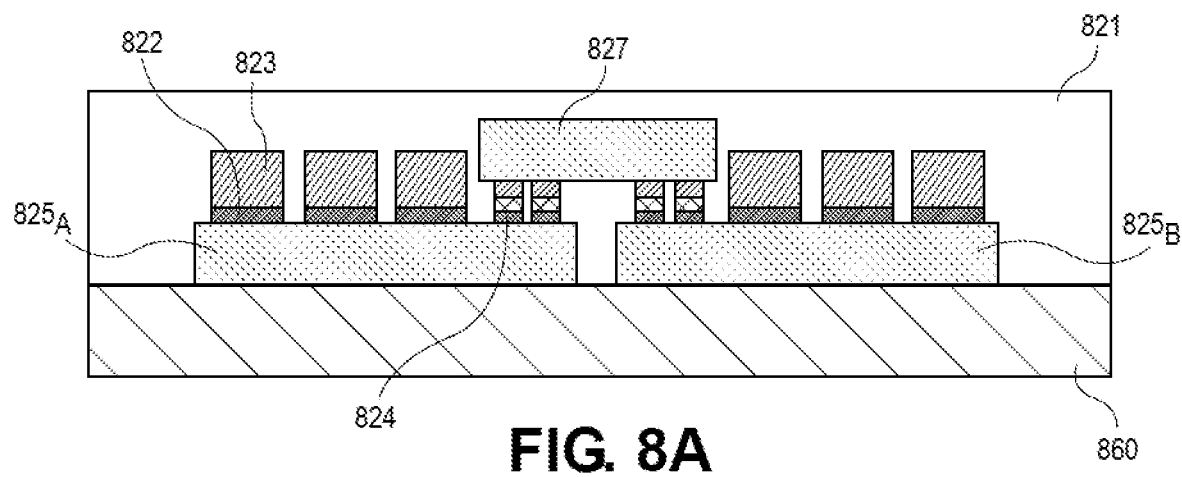
FIGS. 8A-8F are cross-sectional illustrations depicting a process for assembling a multi-chip module with thin dies and a thin bridge die, in accordance with an embodiment.

Referring now to FIG. 8A, a cross-sectional illustration of a pair of base dies $825_A$ and $825_B$ on a carrier 850 is shown, in accordance with an embodiment. The first base die $825_A$ and the second base die $825_A$ may comprise first pads 822 and second pads 824. The first pads 822 may have a first pitch that is greater than a second pitch of the second pads 824. In an embodiment, interconnects, such as conductive pillars 823 may be provided over the first pads 822. For example, the conductive pillars 823 may comprise copper.

In an embodiment, the carrier 850 is a dimensionally stable material with a high stiffness. One objective of the carrier 850 is to provide a base that is not susceptible to warpage. As such, alignment between the first base die $825_A$, the second base die $825_B$, and a bridge die 827 can be tightly controlled. In an embodiment, the carrier 850 may be glass or a metallic material. In some embodiments, the carrier may comprise silicon. In the illustrated embodiment, the first base die $825_A$ and the second base die $825_B$ are directly contacting the carrier 850. However, it is to be appreciated that a temporary adhesive may secure the base dies $825_A$ and $825_B$ to the carrier 850.

In an embodiment, the bridge die 827 is provided over the first base die $825_A$ and the second base die $825_B$. The bridge die 827 provides an electrical connection between the first base die $825_A$ and the second base die $825_B$. In an embodiment, a mold layer 821 may be provided over the first base die $825_A$, the second base die $825_B$, and the bridge die 827.

Figure 8B:
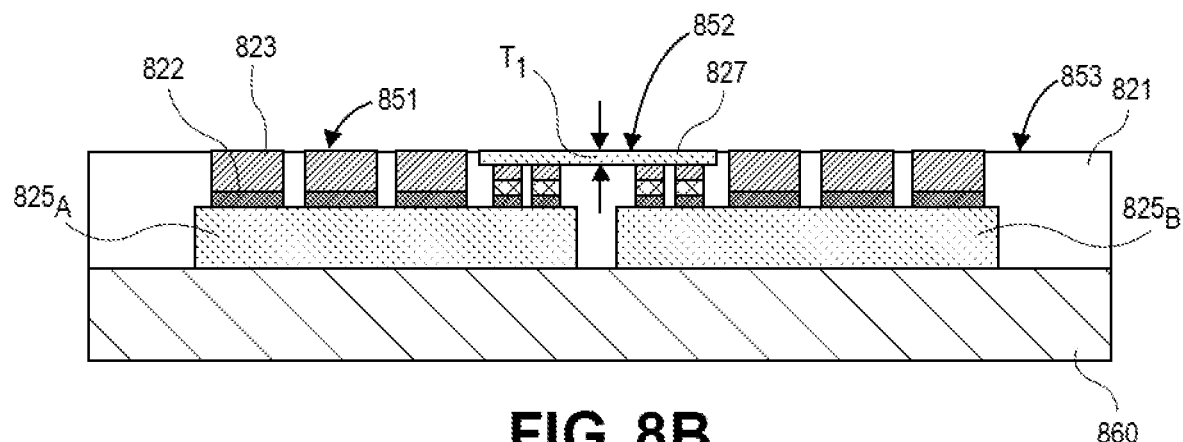

Referring now to FIG. 8B, a cross-sectional illustration of the structure after the mold layer is recessed is shown, in accordance with an embodiment. In an embodiment, the recessing of the mold layer 821 may also recess the conductive pillars 823 and the bridge die 827. Due to the presence of the carrier 850 the structure is supported and able to be aggressively thinned. For example, the bridge die 827 may have a thickness $T_1$ that is approximately 100 μm or less, approximately 50 μm or less, or approximately 30 μm or less.

Figure 8C:
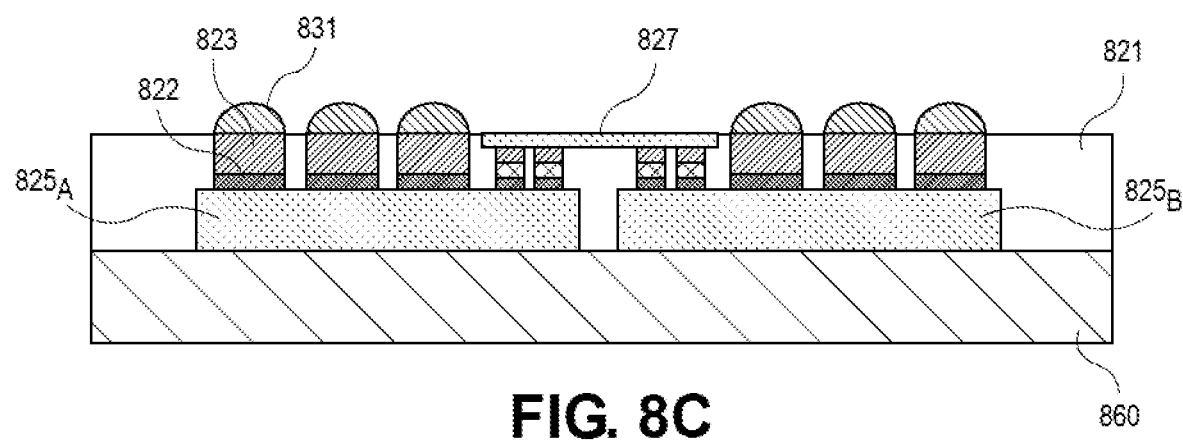

Referring now to FIG. 8C, a cross-sectional illustration of the structure after solder balls 831 are provided on the conductive pillars 823 is shown, in accordance with an embodiment. The solder balls 831 may be applied with any suitable process.

Figure 8D:
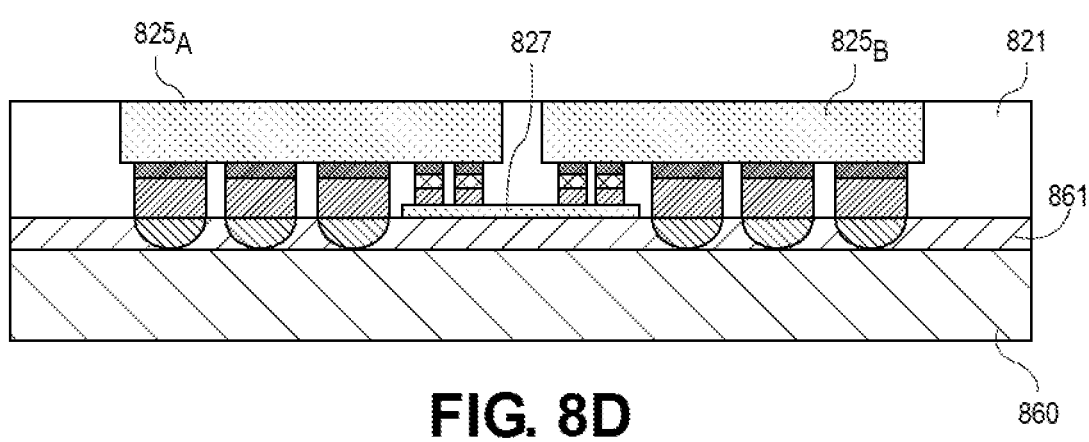

Referring now to FIG. 8D, a cross-sectional illustration of the structure after it is transferred to a second carrier 860 is shown, in accordance with an embodiment. In an embodiment, the structure is released from the first carrier 850 and flipped over so that the solder balls 831 face the second carrier 860. In an embodiment, the structure is adhered to the second carrier 860 by a temporary adhesive layer 861.

Figure 8E:
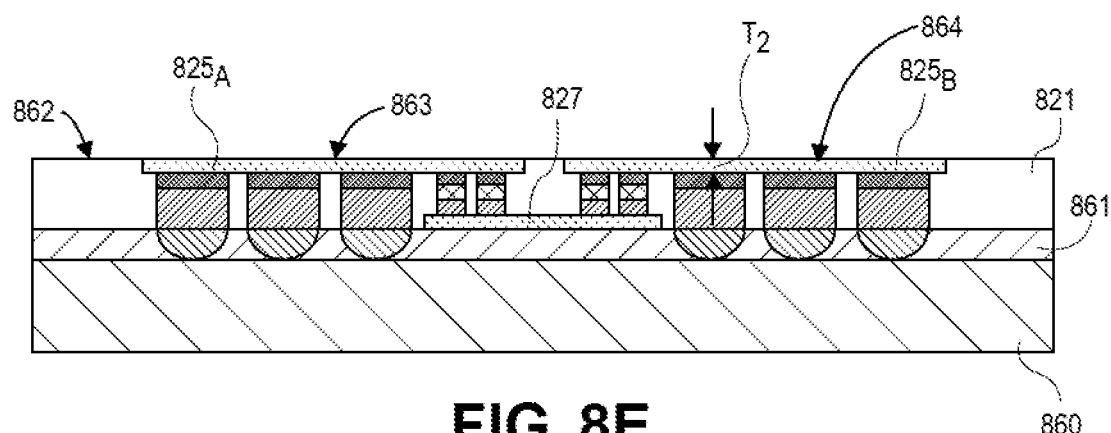

Referring now to FIG. 8E, a cross-sectional illustration of the structure after a second recessing process is shown, in accordance with an embodiment. In an embodiment, the second recessing process may be a grinding process that recesses the thicknesses of the first base die $825_A$ and the second base die $825_B$. For example, the first base die $825_A$ and the second base die $825_B$ may have a second thickness $T_2$. In an embodiment, the second thickness $T_2$ may be approximately 100 μm or less, approximately 50 μm or less, or approximately 30 μm or less. In an embodiment, a backside surface 862 of the mold layer 821 may be substantially coplanar with backside surfaces 863 and 864 of the first base die 825$_A$ and the second die 825$_B$. After the recessing, a reinforcement layer (not shown), (e.g., a tape, a heatsink, or the like) may be applied to the backside surfaces 862, 863, 864 to compensate for warpage due to the thinness of the module.

Figure 8F:
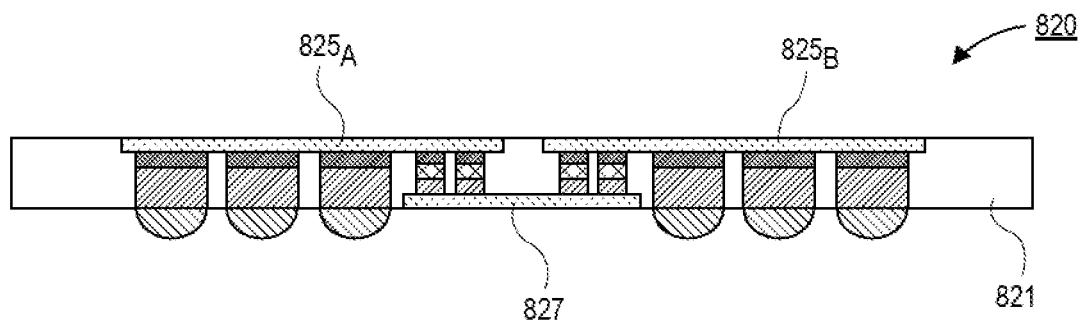

Referring now to FIG. 8F, a cross-sectional illustration of the structure after the second carrier 860 is removed is shown, in accordance with an embodiment. The resulting multi-chip module 820 may then be integrated into an electronic system, such as those described above.

Referring now to FIGS. 9A-9D, plan view illustrations of the base dies 925$_A$ and 925$_B$ are shown, in accordance with an embodiment. Particularly, the architecture of the second pads 924 are shown. As will be described, the architecture of the second pads 924 is formed to allow for compensation of misalignment between the base dies 925$_A$ and 925$_B$.

Figure 9A:
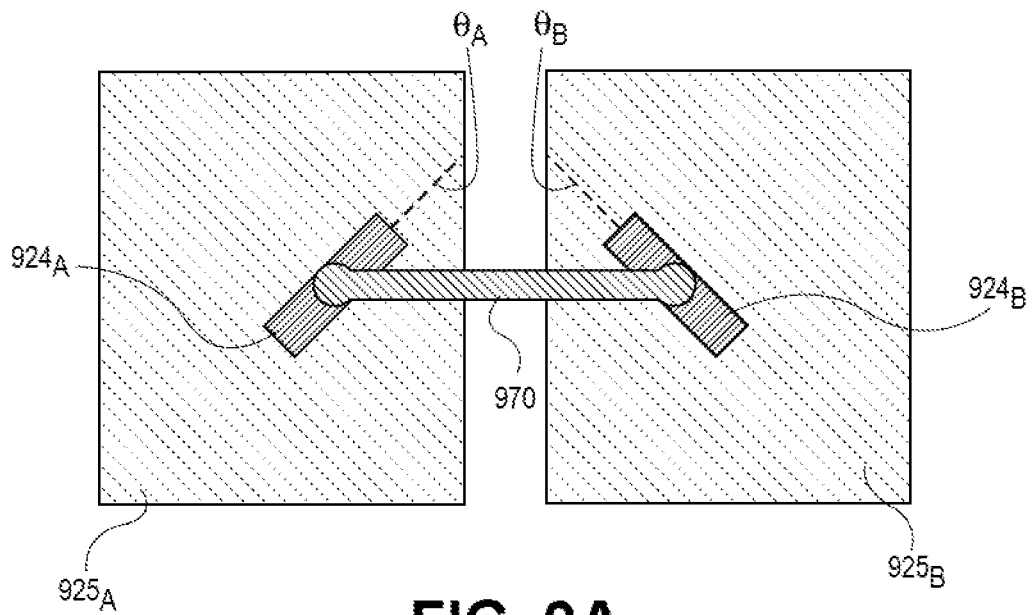
FIGS. 9A-9D are plan view illustrations depicting interconnect architectures capable of accommodating die offsets, in accordance with an embodiment.

Referring now to FIG. 9A, a plan view illustration of the first base die 925$_A$ and the second base die 925$_B$ is shown, in accordance with an embodiment. In an embodiment, a second pad 924$_A$ on the first base die 925$_A$, and a second pad 924$_B$ on the second base die 925$_B$ may be elongated. For example, a length of the second pads 924$_A$ and 924$_B$ may be greater than a width of the second pads 924$_A$ and 924$_B$. In an embodiment, a length direction of the second pads 924$_A$ and 924$_B$ may be at angles with respect to an edge of the base dies 925$_A$ and 925$_B$. For example, the second pad 924$_A$ may be at a first angle θ$_A$, and the second pad 924$_B$ may be at a second angle θ$_B$. In an embodiment, the first angle θ$_A$ may be a mirror image of the second angle θ$_B$. When the first base die 925$_A$ and the second base die 925$_B$ are perfectly aligned, an interconnect 970 on the bridge die (not shown) may land on the second pads 924$_A$ and 924$_B$ at their midpoints.

Figure 9B:
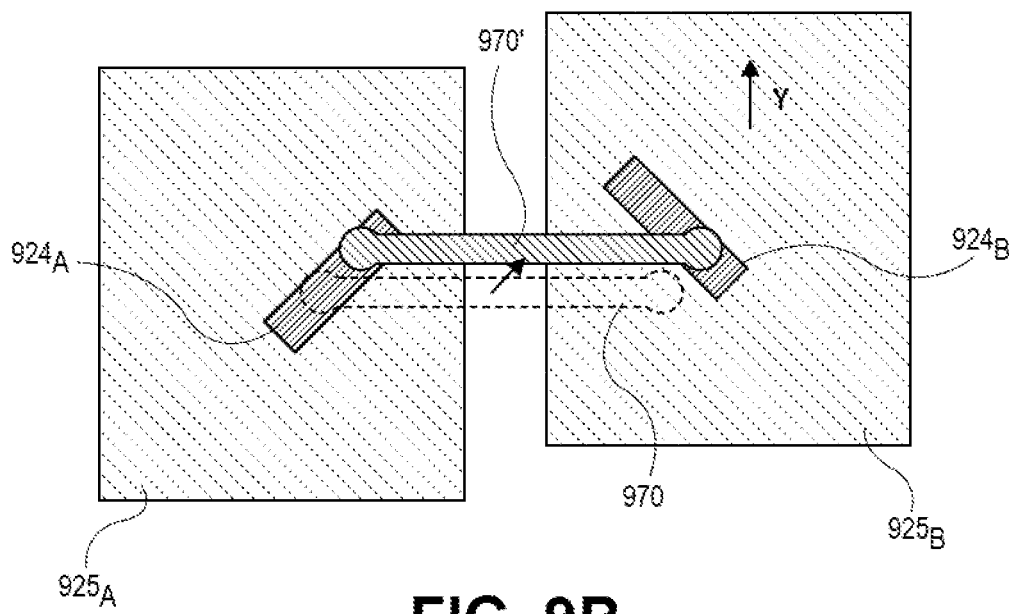

Referring now to FIG. 9B, a plan view illustration of the first base die 925$_A$ and the second base die 925$_B$ with a misalignment is shown, in accordance with an embodiment. As shown, the second base die 925$_B$ is displaced in the vertical Y direction. In order to make the connection between the second pads 924$_A$ and 924$_B$, the interconnect 970 on the bridge die (not shown) is displaced to an offset position 970', as shown by the arrow.

Figure 9C:
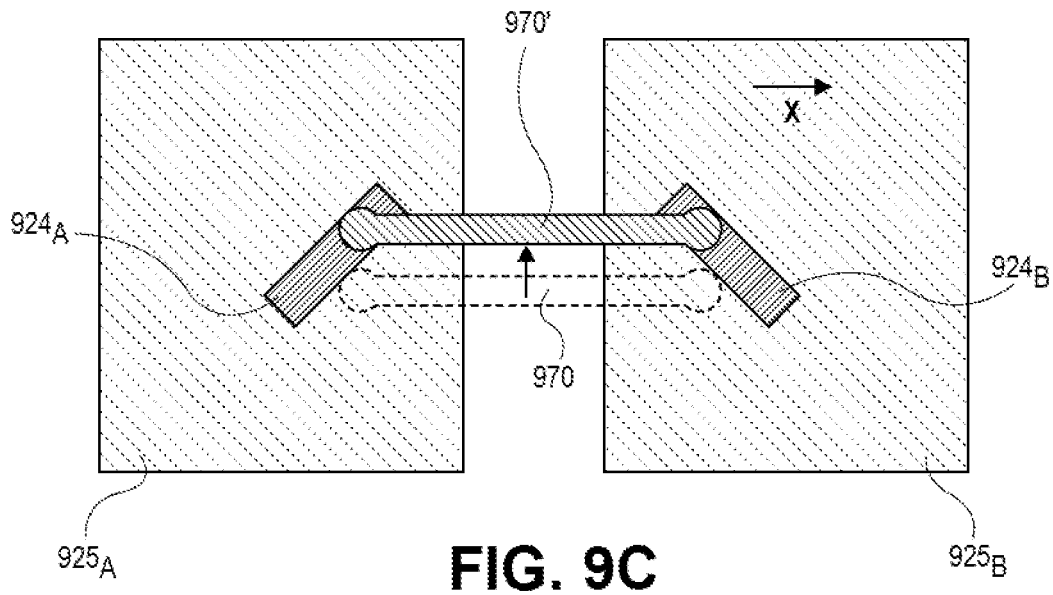

Referring now to FIG. 9C, a plan view illustration of the first base die 925$_A$ and the second base die 925$_B$ with a misalignment is shown, in accordance with an embodiment. As shown, the second base die 925$_B$ is displaced in the horizontal X direction. In order to make the connection between the second pads 924$_A$ and 924$_B$, the interconnect 970 is shifted vertically to position 970', as shown by the arrow.

Figure 9D:
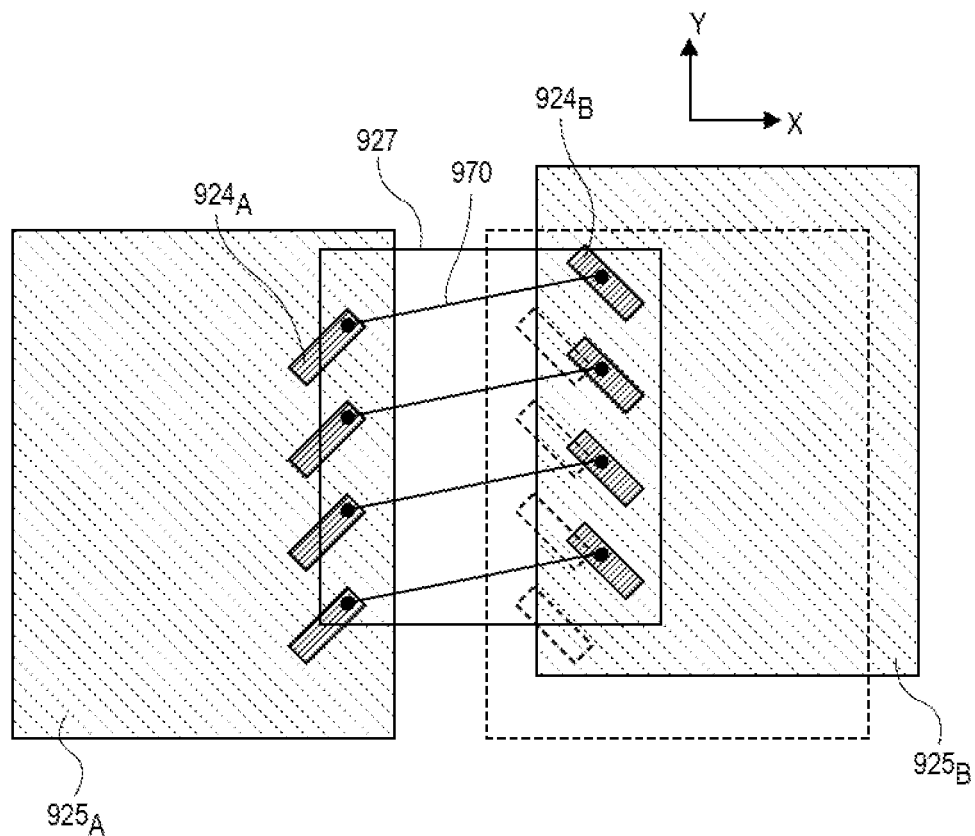

Referring now to FIG. 9D, a plan view illustration of the first base die 925$_A$ and the second base die 925$_B$ with a misalignment is shown, in accordance with an embodiment. As shown, the second base die 925$_B$ is displaced in the horizontal X direction and the vertical Y direction. In order to make the connection between the pads 924$_A$ and 924$_B$, the bridge die 927 may have interconnects 970 that are angled. Alternatively, interconnects 970 may be orthogonal to an edge of the bridge die 927, and the bridge die 927 may itself be rotated.

Figure 10A:
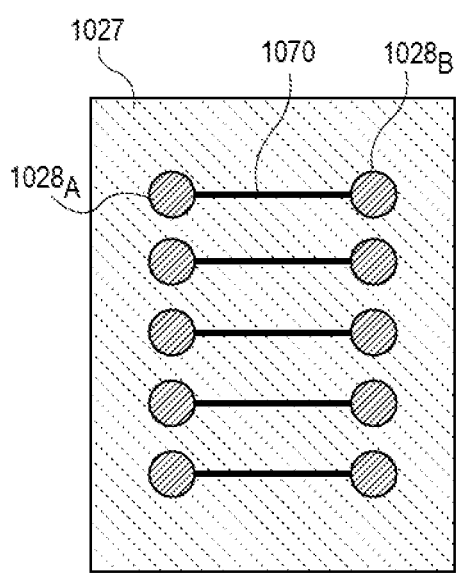
FIGS. 10A-10D plan view illustrations of bridge die architectures to accommodate die misalignments, in accordance with an embodiment.
Figure 10B:
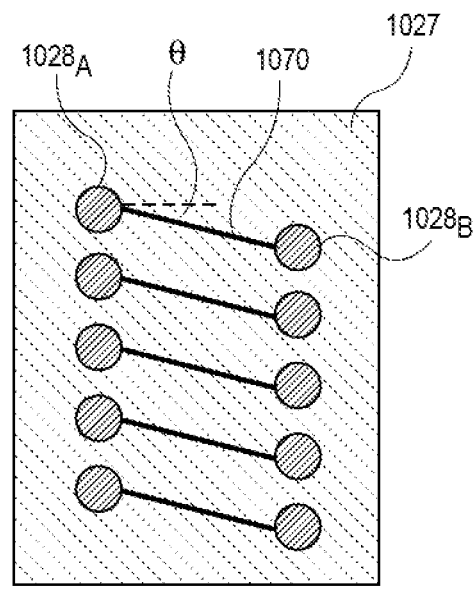

Referring now to FIGS. 10A and 10B, plan view illustrations of bridge dies 1027 are shown, in accordance with an embodiment. In an embodiment, the assembly facility may have a plurality of different bridge die 1027 architectures. Each architecture may account for different misalignments of the bae dies. For example, in FIG. 10A a bridge die 1027 with bridge pads 1028$_A$ and 1028$_B$ that are aligned with each other and connected by a horizontal interconnect 1070 is shown. Such a bridge die 1027 may be suitable for when there is no misalignment between the base dies. In FIG. 10B, the bridge pads 1028$_A$ and 1028$_B$ are misaligned and connected by an interconnect 1070 at an angle θ. Such a bridge die 1027 may be suitable for when there is a misalignment in the Y direction between the base dies. After the base dies are attached, the particular misalignment that is present may be determined and the proper bridge die 1027 may be selected.

Figure 10C:
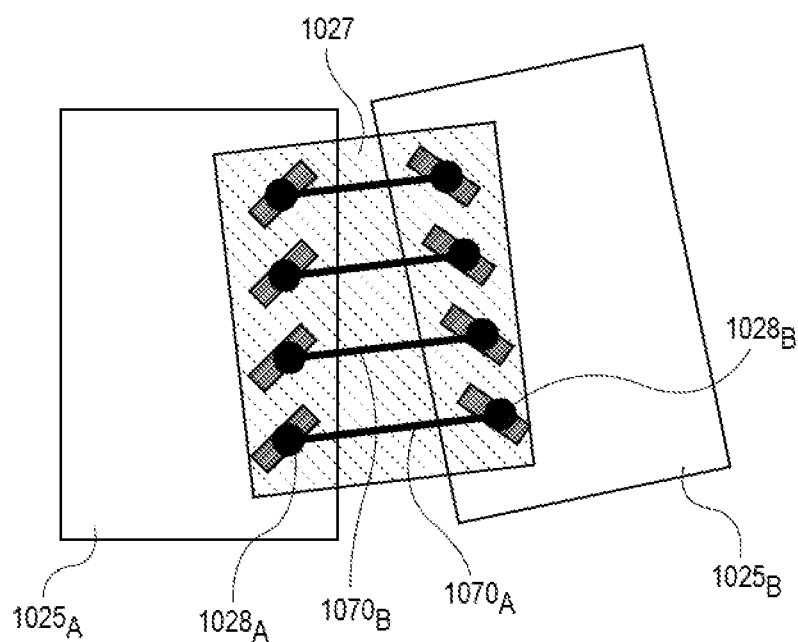

In yet another embodiment, the bridge die 1027 option may have non-uniform interconnect 1070 lengths. Such an embodiment is shown in FIG. 10C. As shown, the interconnect 1070$_A$ is longer than the interconnect 1070$_B$. Such a configuration may account for displacement in more than one direction and/or for rotation of one or both of the base dies 1025.

Figure 10D:
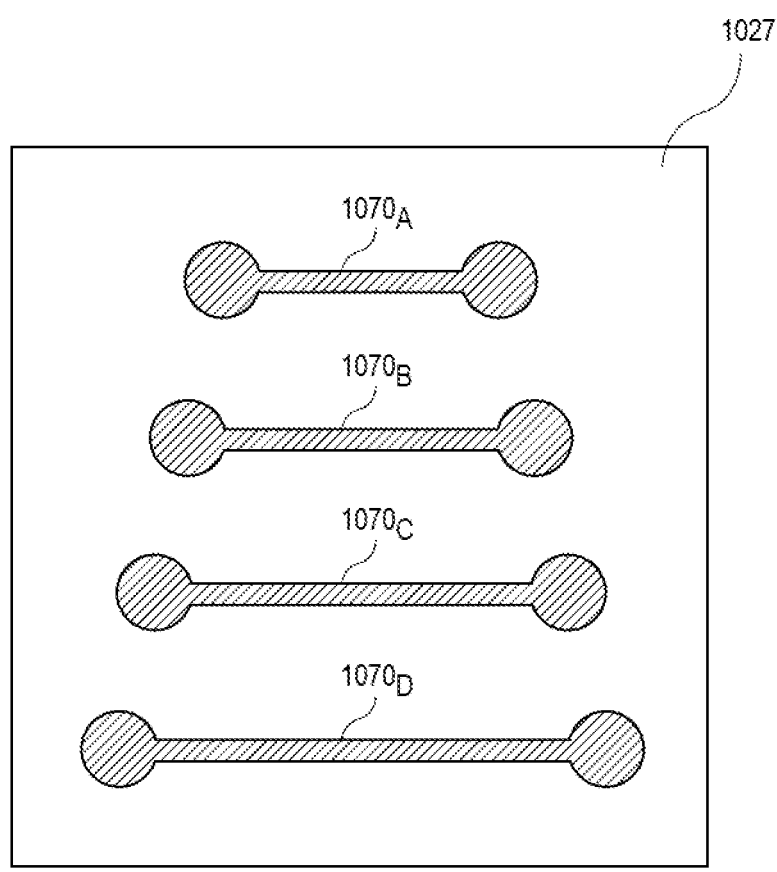

A bridge die 1027 is shown in isolation in FIG. 10D. As shown, the bridge die 1027 has a plurality of interconnects 1070. The interconnects 1070$_{A-D}$ have non-uniform lengths. For example, the interconnect 1070$_A$ is the shortest length, and the interconnect 1070$_D$ is the longest length.

Figure 11:
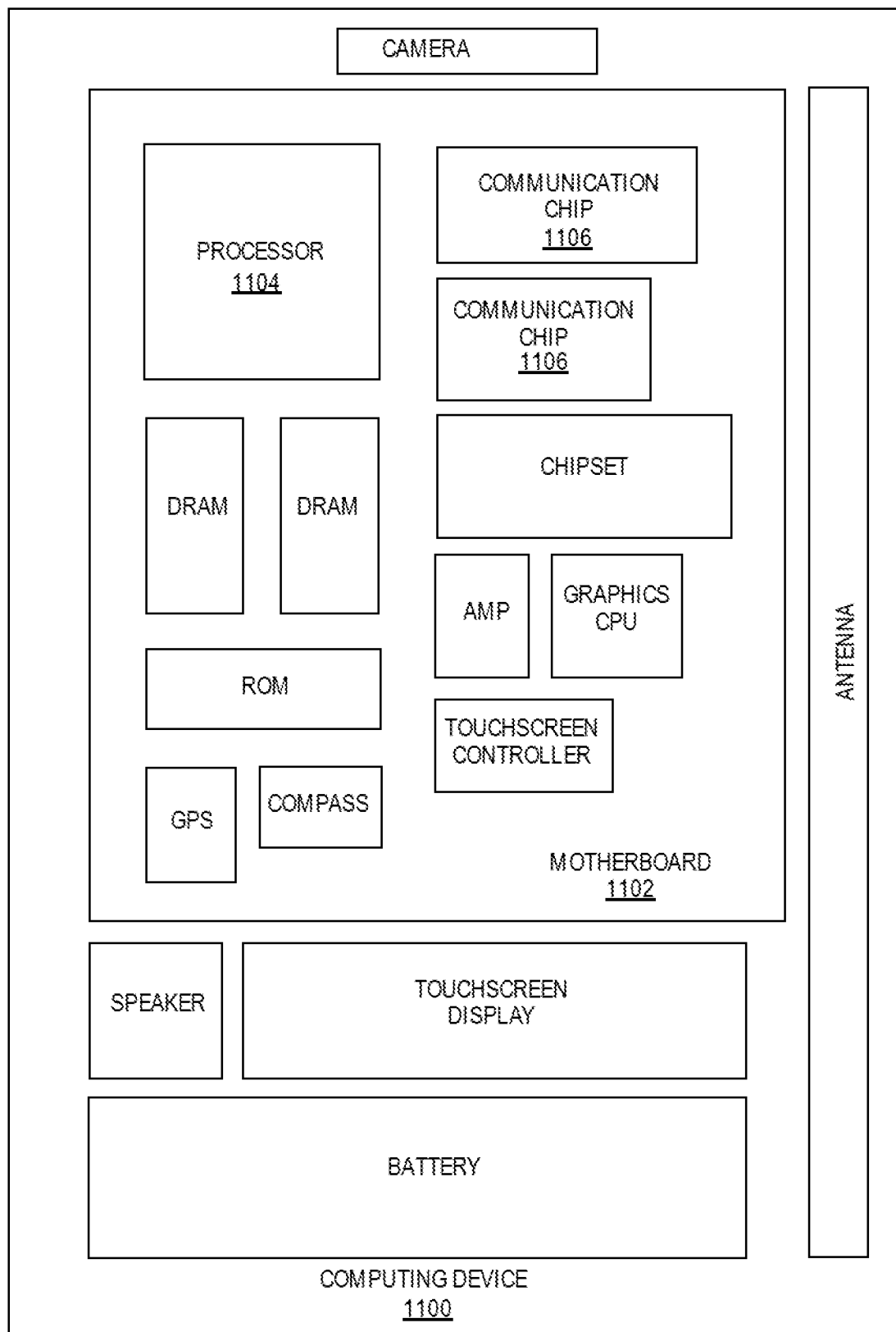
FIG. 11 is a schematic of a computing device built in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may be part of a multi-chip module with a pair of base dies electrically coupled by a bridge die, in accordance with embodiments described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may be part of a multi-chip module with a pair of base dies electrically coupled by a bridge die, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a mold layer; a first die embedded in the mold layer, wherein the first die comprises first pads at a first pitch and second pads at a second pitch; a second die embedded in the mold layer, wherein the second die comprises third pads at the first pitch and fourth pads at the second pitch; and a bridge die embedded in the mold layer, wherein the bridge die electrically couples the second pads to the fourth pads.

Example 2: the electronic package of Example 1, wherein backside surfaces of the first die and the second die are substantially coplanar with a surface of the mold layer.

Example 3: the electronic package of Example 1 or Example 2, wherein a backside surface of the bridge die is substantially coplanar with a surface of the mold layer.

Example 4: the electronic package of Examples 1-3, further comprising conductive interconnects over the first pads and the third pads.

Example 5: the electronic package of Example 4, wherein a backside surface of the bridge die is substantially coplanar with a surface of the conductive interconnects.

Example 6: the electronic package of Example 4, further comprising: a redistribution layer over the mold layer and connected to the conductive interconnects.

Example 7: the electronic package of Examples 1-6, further comprising: fifth pads on the first die, wherein the fifth pads have a third pitch smaller than the first pitch; and a third die attached to the fifth pads, wherein a backside surface of the third die is substantially coplanar with a backside surface of the bridge die.

Example 8: the electronic package of Examples 1-7, further comprising: solder balls over the first pads and the third pads, wherein the solder balls are at least partially embedded in the mold layer.

Example 9: the electronic package of Examples 1-8, further comprising: through substrate vias through the bridge die.

Example 10: the electronic package of Examples 1-9, wherein a thickness of one or more of the first die, the second die, and the bridge die is approximately 30 μm or less.

Example 11: the electronic package of Examples 1-10, wherein the second pads are elongated and at a non-orthogonal first angle with respect to an edge of the first die, and wherein the fourth pads are elongated and at a non-orthogonal second angle with respect to an edge of the second die.

Example 12: the electronic package of Examples 1-11, further comprising: a third die; a fourth die; and a plurality of bridge dies, wherein each of the plurality of bridge dies couple together two of the first die, the second die, the third die, and the fourth die.

Example 13: an electronic package, comprising: a multi-die module, comprising: a mold layer; a first die embedded in the mold layer; a second die embedded in the mold layer; and a bridge die embedded in the mold layer, wherein the bridge die electrically couples the first die to the second die; and a package substrate coupled to the multi-die module.

Example 14: the electronic package of Example 13, wherein the multi-die module is coupled to the package substrate by interconnects.

Example 15: the electronic package of Example 14, wherein the package substrate is coupled to a board.

Example 16: the electronic package of Examples 13-15, further comprising: an active interposer, a passive interposer, or a die between the multi-die module and the package substrate.

Example 17: the electronic package of Example 16, wherein the package substrate is coupled to a board.

Example 18: the electronic package of Examples 13-17, further comprising: a redistribution layer over the mold layer.

Example 19: the electronic package of Example 18, wherein the package substrate is coupled to a board.

Example 20: an electronic system, comprising: a board; and a multi-die module coupled to the board, wherein the multi-die module comprises: a mold layer; a first die embedded in the mold layer; a second die embedded in the mold layer; and a bridge die embedded in the mold layer, wherein the bridge die electrically couples the first die to the second die.

Example 21: the electronic system of Example 20, further comprising: a package substrate between the multi-die module and the board.

Example 22: the electronic system of Example 20 or Example 21, further comprising: conductive pillars on the first die and the second die.

Example 23: the electronic system of Example 22, wherein solder balls are on the conductive pillars.

Example 24: the electronic system of Example 22, wherein a redistribution layer is on the conductive pillars, and wherein solder balls are on the redistribution layer.

Example 25: the electronic system of Examples 20-24, further comprising: a second multi-chip module over the multi-chip module.

What is claimed is:

1. A multi-chip module, comprising:
a redistribution layer;
a bridge die having a top side and a bottom side, the bottom side on and in contact with the redistribution layer, and the bridge die having and a first sidewall and a second sidewall between the top side and the bottom side, the first sidewall laterally opposite the second sidewall, and the bridge die having bridge pads on the top side, and solder on the bridge pads, wherein the bridge die has a plurality of through silicon vias (TSVs) therein;

a mold layer on and in contact with the redistribution layer and laterally adjacent to the first sidewall and the second sidewall of the bridge die, the mold layer having a bottommost surface at a same level as the bottom side of the bridge die;

first conductive pillars in the mold layer and laterally spaced apart from the first sidewall of the bridge die, the first conductive pillars having an uppermost surface above an uppermost surface of the bridge pads of the bridge die, and the first conductive pillars electrically coupled to the redistribution layer;

second conductive pillars in the mold layer and laterally spaced apart from the second sidewall of the bridge die, the second conductive pillars having an uppermost surface above the uppermost surface of the bridge pads of the bridge die, and the second conductive pillars electrically coupled to the redistribution layer;

a first die over the bridge die and over the first conductive pillars, the first die coupled to the first conductive pillars and to a first portion of the bridge pads of the bridge die;

a second die over the bridge die and over the second conductive pillars, the second die laterally spaced apart from the first die, and the second die coupled to the second conductive pillars and to a second portion of the bridge pads of the bridge die, the redistribution layer extending laterally beyond an outer side of the first die and an outer side of the second die, wherein the mold layer has an uppermost surface at most as high as an uppermost surface of the first die and the second die; and a plurality of solder balls beneath and coupled to the redistribution layer, the plurality of solder balls beneath the first conductive pillars, beneath the bridge die, and beneath the second conductive pillars.

2. The multi-chip module of claim 1, wherein the mold layer is in direct contact with the first sidewall and the second sidewall of the bridge die.

3. The multi-chip module of claim 1, wherein the mold layer has an uppermost surface above the top side of the bridge die.

4. The multi-chip module of claim 1, wherein the uppermost surface of the mold layer is at a same level as an uppermost surface of the first die and at a same level as an uppermost surface of the second die.

5. The multi-chip module of claim 1, wherein the redistribution layer has an edge in vertical alignment with an edge of the mold layer.

6. The multi-chip module of claim 5, wherein the redistribution layer has a second edge in vertical alignment with a second edge of the mold layer, the second edge of the redistribution layer laterally opposite the edge of the redistribution layer, and the second edge of the mold layer laterally opposite the edge of the mold layer.

7. The multi-chip module of claim 1, wherein a portion of the plurality of solder balls is outside of a footprint of the first die and the second die.

8. A multi-chip module, comprising:

a layer for pitch spreading and integration;

a first die on and in contact with the layer for pitch spreading and integration, the first die having a first bridge pad and a second bridge pad, and solder on the first bridge pad and the second bridge pad, wherein the first die has a plurality of through silicon vias (TSVs) therein;

a mold layer on and in contact with the layer for pitch spreading and integration and laterally adjacent to a first sidewall and a second sidewall of the first die, the mold layer having a bottommost surface at a same level as the bottom side of the first die;

a first conductive pillar in the mold layer and laterally spaced apart from the first sidewall of the first die, the first conductive pillar having an uppermost surface above an uppermost surface of the first bridge pad and the second bridge pad, and the first conductive pillar electrically coupled to the layer for pitch spreading and integration;

a second conductive pillar in the mold layer and laterally spaced apart from the second sidewall of the first die, the second conductive pillar having an uppermost surface above the uppermost surface of the first bridge pad and the second bridge pad, and the second conductive pillar electrically coupled to the layer for pitch spreading and integration;

a second die over the first die and over the first conductive pillar, the second die coupled to the first conductive pillar and to the first bridge pad;

a third die over the first die and over the second conductive pillar, the third die laterally spaced apart from the first die, and the third die coupled to the second conductive pillar and to the second bridge pad, the layer for pitch spreading and integration extending laterally beyond an outer side of the second die and an outer side of the third die, wherein the mold layer has an uppermost surface at most as high as an uppermost surface of the second die and the third die; and a first solder ball beneath the first conductive pillar, a second solder ball beneath the first die, and a third solder ball beneath the second conductive pillar.

9. The multi-chip module of claim 8, wherein the mold layer is in direct contact with the first sidewall and the second sidewall of the first die.

10. The multi-chip module of claim 8, wherein the mold layer has an uppermost surface above the top side of the first die.

11. The multi-chip module of claim 8, wherein the uppermost surface of the mold layer is at a same level as an uppermost surface of the second die and at a same level as an uppermost surface of the third die.

12. The multi-chip module of claim 8, wherein the layer for pitch spreading and integration has a first edge in vertical alignment with a first edge of the mold layer, and wherein the layer for pitch spreading and integration has a second edge in vertical alignment with a second edge of the mold layer, the second edge of the layer for pitch spreading and integration laterally opposite the first edge of the layer for pitch spreading and integration, and the second edge of the mold layer laterally opposite the first edge of the mold layer.

13. The multi-chip module of claim 8, further comprising a fourth solder ball outside of a footprint of the second die and the third die.

14. A multi-chip module, comprising:

a redistribution layer;

a bridge die having a top side and a bottom side, the bottom side on and in contact with the redistribution layer, and the bridge die having and a first sidewall and a second sidewall between the top side and the bottom side, the first sidewall laterally opposite the second sidewall, and the bridge die having bridge pads on the top side, and solder on the bridge pads, wherein the bridge die has a plurality of through silicon vias (TSVs) therein;

a mold layer on and in contact with the redistribution layer and laterally adjacent to the first sidewall and the second sidewall of the bridge die, the mold layer having a bottommost surface at a same level as the bottom side of the bridge die;

conductive pillars in the mold layer and laterally spaced apart from the first sidewall of the bridge die and laterally spaced apart from the second sidewall of the bridge die, the conductive pillars having an uppermost surface above an uppermost surface of the bridge pads, and the conductive pillars electrically coupled to the redistribution layer;

a first die over the bridge die and over a first portion of the conductive pillars, the first die coupled to the first portion of the conductive pillars and to a first portion of the bridge pads;

a second die over the bridge die and over a second portion of the conductive pillars, the second die laterally spaced apart from the first die, and the second die coupled to the second portion of the conductive pillars and to a second portion of the bridge pads, the redistribution layer extending laterally beyond an outer side of the first die and an outer side of the second die, wherein the mold layer has an uppermost surface at most as high as an uppermost surface of the first die and the second die; and solder balls beneath and coupled to the redistribution layer, the solder balls beneath the conductive pillars and beneath the bridge die.

15. The multi-chip module of claim 14, wherein the mold layer is in direct contact with the first sidewall and the second sidewall of the bridge die.

16. The multi-chip module of claim 14, wherein the mold layer has an uppermost surface above the top side of the bridge die.

17. The multi-chip module of claim 14, wherein the uppermost surface of the mold layer is at a same level as an uppermost surface of the first die and at a same level as an uppermost surface of the second die.

18. The multi-chip module of claim 14, wherein the redistribution layer has an edge in vertical alignment with an edge of the mold layer.

19. The multi-chip module of claim 14, wherein the redistribution layer has a second edge in vertical alignment with a second edge of the mold layer, the second edge of the redistribution layer laterally opposite the edge of the redistribution layer, and the second edge of the mold layer laterally opposite the edge of the mold layer.

20. The multi-chip module of claim 14, a portion of the solder balls is outside of a footprint of the first die and the second die.

* * * * *